(12) United States Patent
Kathirgamanathan

(10) Patent No.: US 7,354,661 B2
(45) Date of Patent: Apr. 8, 2008

(54) ELECTROLUMINESCENT DEVICES

(75) Inventor: Poopathy Kathirgamanathan, North Harrow (GB)

(73) Assignee: OLED-T Limited, Enfield (GB)

( * ) Notice: Subject to any disclaimer, the term of this patent is extended or adjusted under 35 U.S.C. 154(b) by 229 days.

(21) Appl. No.: 10/480,871

(22) PCT Filed: Jun. 14, 2002

(86) PCT No.: PCT/GB02/02722

§ 371 (c)(1),
(2), (4) Date: Jan. 30, 2004

(87) PCT Pub. No.: WO02/102924

PCT Pub. Date: Dec. 27, 2002

(65) Prior Publication Data

US 2004/0166364 A1     Aug. 26, 2004

(30) Foreign Application Priority Data

Jun. 15, 2001  (GB) ................................. 0114710.7
Nov. 23, 2001  (GB) ................................. 0128118.7

(51) Int. Cl.
    H01L 51/54   (2006.01)
    C09K 11/06   (2006.01)
(52) U.S. Cl. .................. 428/690; 428/917; 313/504; 313/506; 257/40; 257/E51.043
(58) Field of Classification Search ............ None
    See application file for complete search history.

(56) References Cited

U.S. PATENT DOCUMENTS

| | | | |
|---|---|---|---|
| 4,356,429 A | 10/1982 | Tang | |
| 4,455,364 A | 6/1984 | Sasa | |
| 4,720,432 A | 1/1988 | VanSlyke et al. | |
| 4,885,211 A | 12/1989 | Tang et al. | |
| 5,128,587 A | 7/1992 | Skotheim et al. | |
| 5,281,489 A | 1/1994 | Mori et al. | |
| 5,503,910 A * | 4/1996 | Matsuura et al. | 428/212 |
| 5,703,436 A * | 12/1997 | Forrest et al. | 313/506 |
| 5,755,999 A | 5/1998 | Shi et al. | |
| 5,757,026 A | 5/1998 | Forrest et al. | |
| 5,776,622 A * | 7/1998 | Hung et al. | 428/690 |
| 5,807,627 A | 9/1998 | Friend et al. | |
| 6,001,284 A * | 12/1999 | Enokida et al. | 252/583 |
| 6,083,634 A * | 7/2000 | Shi | 428/690 |
| 6,153,726 A | 11/2000 | Kathirgamanathan et al. | |
| 6,887,398 B1 * | 5/2005 | Finmans et al. | 252/182.14 |
| 2003/0218418 A9 * | 11/2003 | Sato et al. | 313/504 |

FOREIGN PATENT DOCUMENTS

| | | |
|---|---|---|
| EP | 0 087 309 A | 8/1983 |
| EP | 0 278 629 A | 8/1988 |
| EP | 0 461 542 A | 12/1991 |
| EP | 0 556 005 A | 8/1993 |
| EP | 0 569 827 A | 11/1993 |
| EP | 0 744 451 A | 11/1996 |
| EP | 0 936 844 A | 8/1999 |
| EP | 1 074 600 A2 | 2/2001 |
| JP | 61037887 | 2/1986 |
| JP | 1-256584 | 10/1989 |
| JP | 1-282291 | 11/1989 |
| JP | 06 145146 A | 5/1994 |
| JP | 2000091078 A | 3/2000 |
| WO | WO 90/13148 | 11/1990 |
| WO | WO 92/03490 | 3/1992 |
| WO | WO 98/02018 | 1/1998 |
| WO | WO 98/55561 | 12/1998 |
| WO | WO 98/58037 | 12/1998 |
| WO | WO 99/16739 A1 * | 4/1999 |
| WO | WO 00/26323 | 5/2000 |
| WO | WO 00/32717 | 6/2000 |
| WO | WO 00/32718 | 6/2000 |
| WO | WO 00/32719 | 6/2000 |
| WO | WO 00/44851 | 8/2000 |
| WO | WO 00/60669 | 10/2000 |
| WO | WO 02/43444 | 5/2002 |
| WO | WO 02/43446 | 5/2002 |
| WO | WO 02/43447 | 5/2002 |
| WO | WO 02/086014 | 10/2002 |
| WO | WO 02/086015 | 10/2002 |
| WO | WO 02/087283 | 10/2002 |
| WO | WO 02/087288 | 10/2002 |
| WO | WO 02/090465 | 11/2002 |
| WO | WO 02/090466 | 11/2002 |
| WO | WO 02/091493 | 11/2002 |
| WO | WO 02/102924 | 12/2002 |

(Continued)

OTHER PUBLICATIONS

Y. Hamada, et al., Blue Electroluminescence in Thin Films of Azomethin-Zinc Complexes, Japanese Journal of Applied Physics, vol. 32, Apr. 1, 1993, No. 4A, pp. L511-L513.
M. Berggren, et al., Ultraviolet Electroluminescence from an Organic Light Emitting Diode, Advance Materials, 7 (1995), November No. 11; pp. 900-903.
N. Armaroll, Luminescence properties of Eu3+, Tb3-, and Gd3+ complexes of the hexadentate N-donor podand tris-[3-(2-pyridyl) pyrazol-lyl] hydroborate, Chemical Physics Letters 276, Sep. 26, 1997, pp. 435-440.
N.C. Greenham, et al., Measurement of absolute photoluminescence quantum efficiencies in conjugated polymers, Chemical Physics Letters, Jul. 1995, 241, pp. 89-96.
L. Liu, et al., Europium complexes as emitters in organic electroluminescent devices, Synthetic Metals 91, 1997, pp. 267-269.
S. Dirr, et al., Luminescence enhancement in microcavity organic multilayer structures, Synthetic Metals, 9, 1997, pp. 53-56.

(Continued)

Primary Examiner—Marie Yamnitzky
(74) Attorney, Agent, or Firm—Daivd Silverstein; Andover-IP-Law

(57) ABSTRACT

An electroluminescent device has, as the electroluminescent layer, a metal compound selected from organic complexes of non rare earth metals.

17 Claims, 23 Drawing Sheets

FOREIGN PATENT DOCUMENTS

| WO | WO 03/006573 | 1/2003 |
|---|---|---|
| WO | WO 03/014256 | 2/2003 |

OTHER PUBLICATIONS

J. Kido, et al., White-Light Emitting Organic Electroluminescent Device Using Lanhanide Complexes, Japanese Journal of Applied Physics No. 35, 1996, pp. L304-L396.

K. Hensen, et al. Darstellung Von N-BZW, O-Chlormethylsilyl-Derivaten der Armine 1,2,3,4-Tetrahydro-1, 10-Phenanthrolin und 8-Hydroxychinolin, J. of Organometallic Chemistry, 209, 1981, pp. 17-23.

J. Kido, et al. Organic Electroluminescent Devices Using Lanthanide Complexes; Department of Materials Science of Engineering, 1995, Yamagata University, Yamagata Japan, pp. 110-111, source not given.

C.J. Kepert, et al., Structural Systematics of Rare Earth Complexes; V+ The Hydrated 1:1 Adducts of 2,2':6'2"-Terpyrid with Lanthanoid (III) Chlorides, Australisan Journal of Chemistry, 1994,, 47, pp. 365-384.

K. Machida, et al., Redox Behavior and Luminescence Property of Europium Polymer Complexes, Department of Applied Chemistry, Faculty of Engineering, Osaka University, Osaka, Japan 1991, pp. 70-71, source not given.

K. Hayashi, et al., Syntheses and Structural Studies of Lanthanide Mixed Ligand Complexes containing B-diketone, Department of Chemistry, Faculty of Science, Ochanomizu University, Tokyo, Japan, 1996, pp. 210-211, source not given.

K. Tsuchiya, et al., Complex Formation and Its High Dispersion in the Simultaneous Vaccum Deposition of Copper and Phthalocyanine, Faculty of Engineering, Yamagata University, Yonezawa, Japan, 1998, pp. 149-154, source not given.

L. K. Templeton, et al., Anomalous Scattering by Praseodymium, Samarium and Gadolinium and Structures of their Ethylenediaminetetraacetate (edta) Salts, Acta. Cryst. (1982), B38, pp. 2155-2159.

J. Kido, et al., Bright red light-emitting organic electroluminscent devices having a europium complex as an emitter, Applied Physics Letters, 65 (17), Oct. 1994, pp. 2124-2126.

T. Wakimoto, et al., Organic EL cells with high luminous efficiency, Applied Science 113/114 (1997) pp. 698-704.

J. Kido, et al., Electroluminescence in a Terbium Complex, Chemistry Letters, The Chemistry Society of Japan, 1990, pp. 657-660.

J. Kido, et al., Multilayer White Light-Emitting Organic Electroluminescent Device, Science, vol. 267, Mar. 1995, pp. 1332-1334.

H. Spreitzer, et al., Soluble Phenyl-Substituted PPVs-New Materials for Highly Efficient Polymer LEDs, Advanced Materials, 10 (1998), No. 16, pp. 1340-1343.

C. C. Wu, et al., Poly(p-phenylene vinylene)/tris(8-hydroxy) quinoline aluminum heterostructure light emitting diode, 320 Applied Physics Letters 66 (1995) February, No. 6, Woodbury, NY, US, pp. 653-655.

A. MacDiarmid, et al., Polyanilines: A Novel Class of Conducting Polymers, Farady Discussions, Chem. Soc. 88 1989, pp. 317-331.

* cited by examiner m= 0,1,2 etc.
n= 0,1,2 etc.

n = 0,1,2 etc.

m= 0,1,2 etc.
m= 0,1,2 etc.

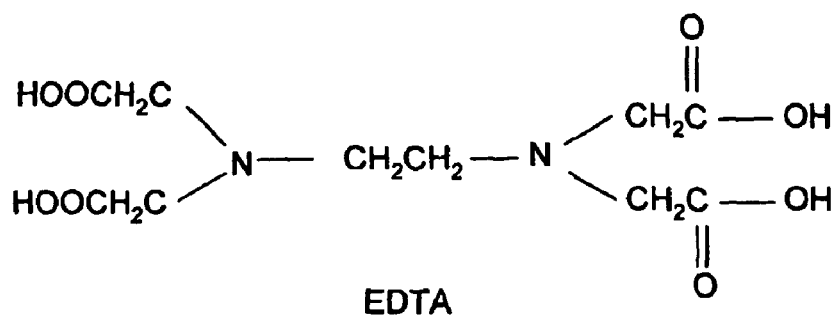
EDTA
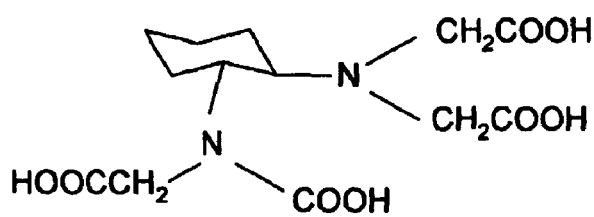
DCTA
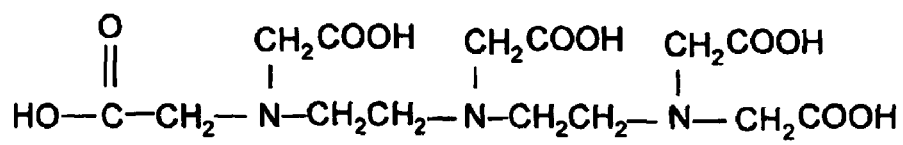
DTPA
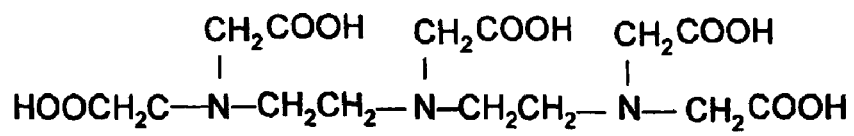
TTHA
Fig. 9

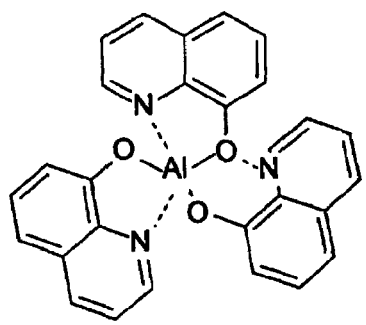
Alq
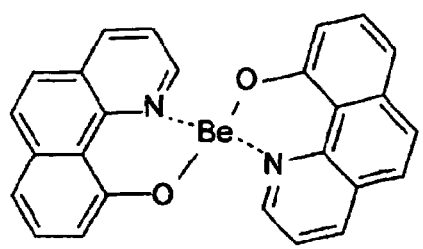
Bebq
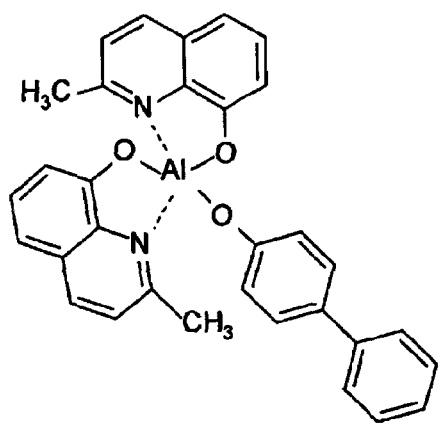
BAlq1
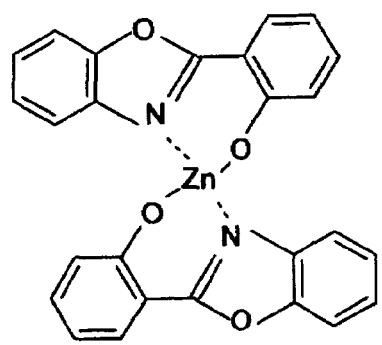
ZnPBO
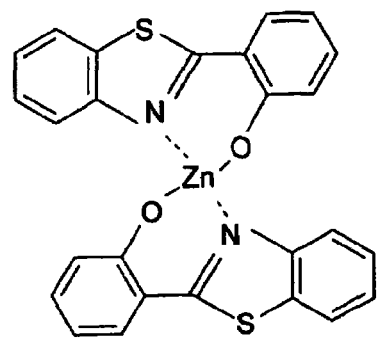
ZnPBT
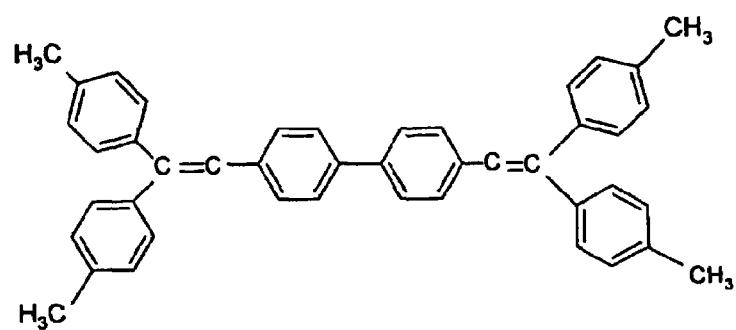
DTVb1
Fig. 10

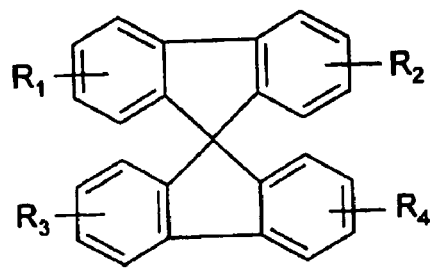
Fig. 16a
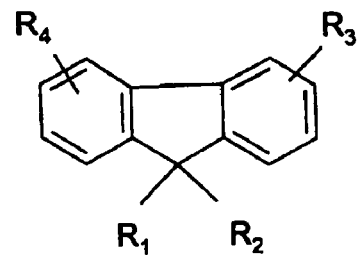
Fig. 16b
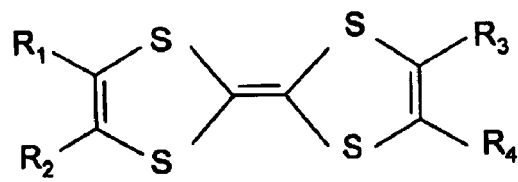
or
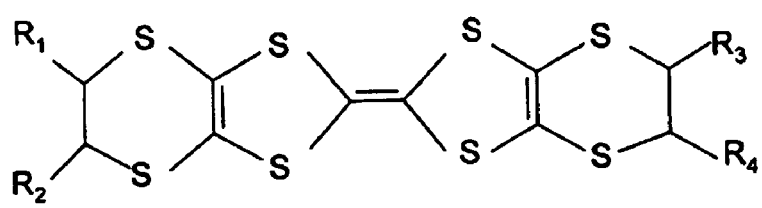
Fig. 16c
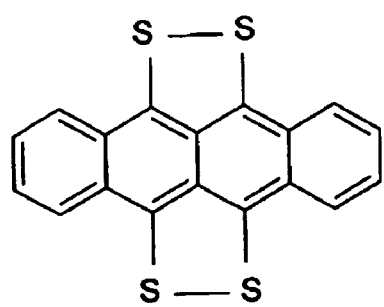
Fig. 16d Luminescent -voltage-luminescent efficiency characterisation Luminescent efficiency - voltage-current efficiency characterisation

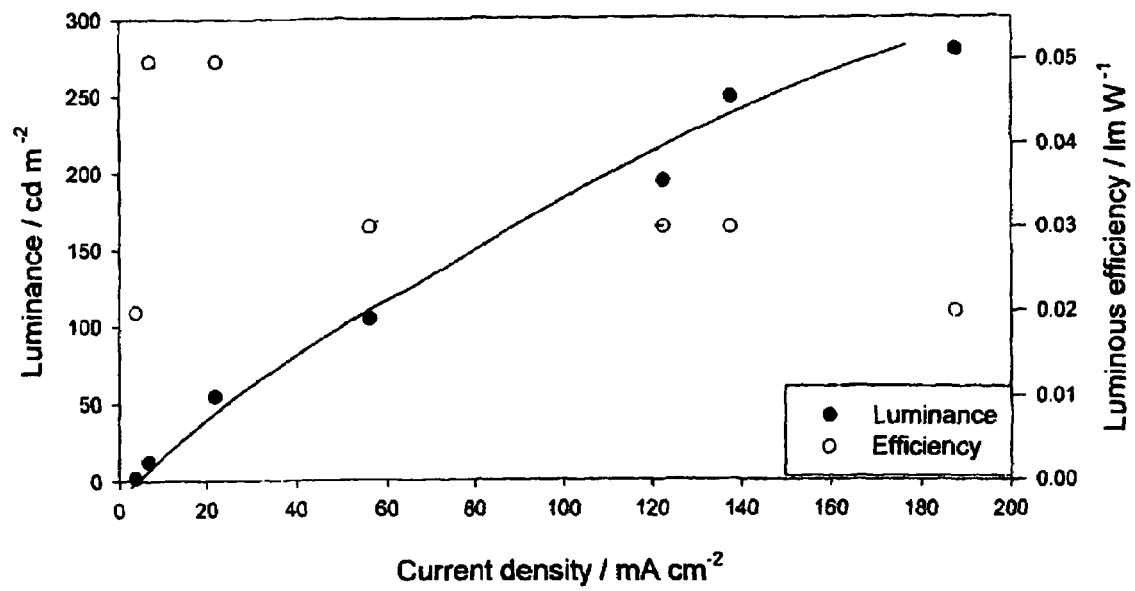
Fig. 21 Luminescent - current density-luminescent efficiency characterisation
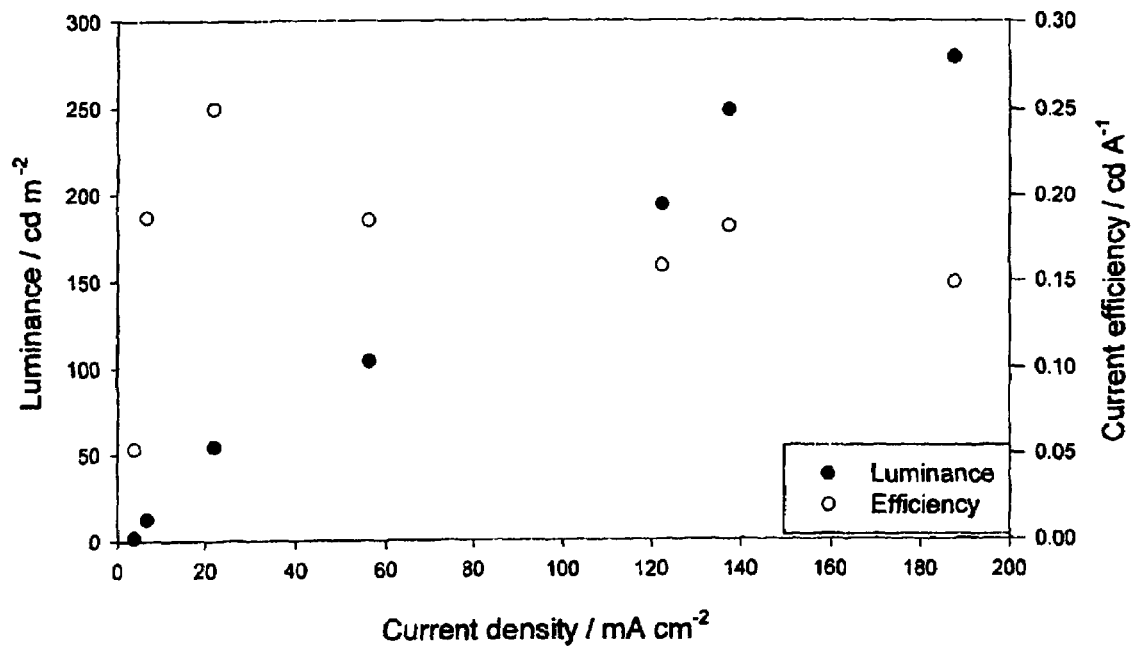
Fig. 22 Luminescent - current density-current efficiency characterisation

ELECTROLUMINESCENT DEVICES

The present invention relates to electroluminescent devices.

Materials which emit light when an electric current is passed through them are well known and used in a wide range of display applications. Liquid crystal devices and devices which are based on inorganic semiconductor systems are widely used, however these suffer from the disadvantages of high energy consumption, high cost of manufacture, low quantum efficiency and the inability to make flat panel displays.

Organic polymers have been proposed as useful in electroluminescent devices, but it is not possible to obtain pure colours, they are expensive to make and have a relatively low efficiency.

Another compound which has been proposed is aluminium quinolate, but this requires dopants to be used to obtain a range of colours and has a relatively low efficiency.

Patent application WO98/58037 describes a range of lanthanide complexes which can be used in electroluminescent devices which have improved properties and give better results. Patent Applications PCT/GB98/01773, PCT/GB99/03619, PCT/GB99/04030, PCT/GB99/04024, PCT/GB99/04028, PCT/GB00/00268 describe electroluminescent complexes, structures and devices using rare earth chelates.

Apart from aluminium quinolate which is a poor electroluminescent compound all electroluminescent compounds have been based on rare earths, lanthanide and actinide complexes.

We have now devised improved electroluminescent devices and structures using a non rare earth complex.

According to the invention there is provided an electroluminescent structure comprising (i) a first electrode and (ii) an electroluminescent layer comprising a layer of a light emitting metal compound selected from organic complexes of non rare earth metals and (iii) a second electrode.

The invention also provides an electroluminescent device comprising (i) a first electrode, (ii) a layer of a hole transmitting material (iii) an electroluminescent layer comprising a layer of a light emitting metal compound selected from organic complexes of non rare earth metals and (iv) a second electrode.

The complexes have the formula (M) (Lα)$_n$ where M is the metal and n is the valency state of the metal.

The light emitting metal compound can be formed from any metal compound selected from non rare earth metals e.g. lithium, sodium, potassium, rubidium, caesium, beryllium, magnesium, calcium, strontium, barium, copper, silver, gold, zinc, cadmium, boron, aluminium, gallium, indium, germanium, tin, antimony, lead, and metals of the first, second and third groups of transition metals e.g. manganese, iron, ruthenium, osmium, cobalt, nickel, palladium, platinum, cadmium, chromium. titanium, vanadium, zirconium, tantulum, molybdenum, rhodium, iridium, titanium, niobium, scandium, yttrium etc. which emit light when an electric current is passed through it.

BRIEF DESCRIPTION OF THE DRAWINGS

FIGS. 1-9 show exemplary ligands L$_α$ and Lp as described in this application.

FIGS. 10 and 11 show exemplary quinolates and other electron transmitting materials as described in this application.

FIGS. 12-16 show exemplary hole transmitting materials as described in this application.

FIG. 21 is a plot of luminance and luminous efficiency against current density for the device of Example 1 as described in this application.

FIG. 22 is a plot of luminance and current efficiency against current density for the device of Example 1 as described in this application.

Figure 1:
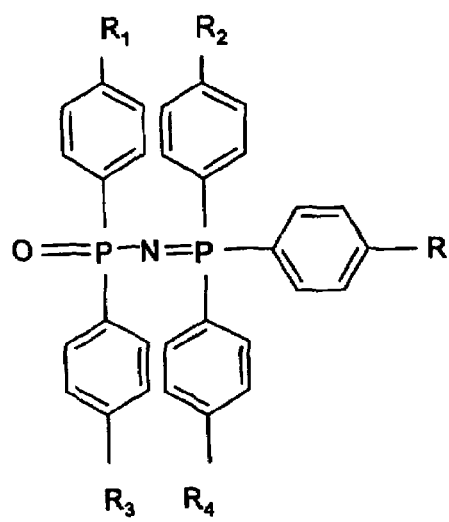

Preferably Lα is selected from β diketones such as those of formulae

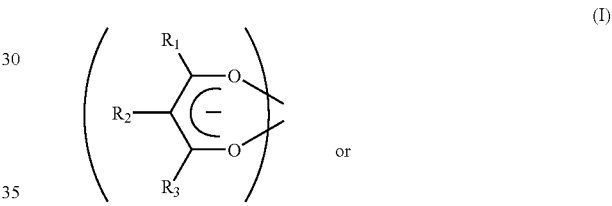

or

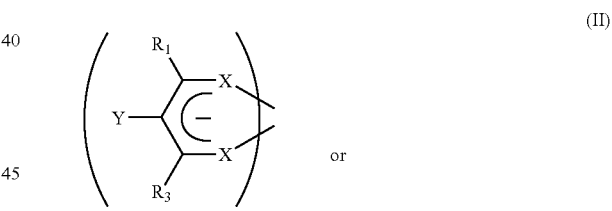

or

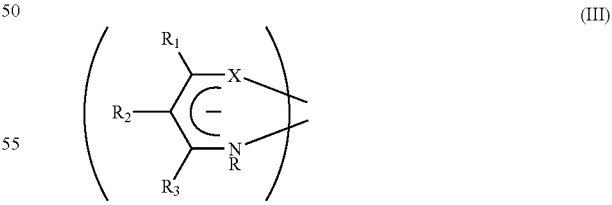

where $R_1$, $R_2$ and $R_3$ can be the same or different and are selected from hydrogen, and substituted and unsubstituted hydrocarbyl groups such substituted and unsubstituted aliphatic groups, substituted and wisubstituted aromatic, beterocyclic and polycyclic ring structures, fluorocarbons such as trifluoryl methyl groups, halogens such as fluorine or thiophenyl groups; $R_1$, $R_2$ and $R_3$ can also form substituted and unsubstituted fused aromatic, heterocyclic and polycyclic ring structures and can be copolymerisable with a monomer e.g. styrene. X is Se, S or O, Y can be hydrogen, substituted or unsubstituted hydrocarbyl groups, such as substituted and unsubstituted aromatic, heterocyclic and polycyclic ring structures, fluorine, fluorocarbons such as trifluoryl methyl groups, halogens such as fluorine or thiophenyl groups or nitrile.

Examples of $R_1$ and/or $R_2$ and/or $R_3$ include aliphatic, aromatic and heterocyclic alkoxy, aryloxy and carboxy groups, substituted and substituted phenyl, fluorophenyl, biphenyl, phenanthrene, anthracene, naphthyl and fluorene groups alkyl groups such as t-butyl, heterocyclic groups such as carbazole.

Some of the different groups Lα may also be the same or different charged groups such as carboxylate groups so that the group $L_1$ can be as defined above and the groups $L_2$, $L_3$ ... can be charged groups such as

(IV)

where R is $R_1$ as defined above or the groups $L_1$, $L_2$ can be as defined above and $L_3$ ... etc. are other charged groups.

$R_1$, $R_2$ and $R_3$ can also be

(V)

where X is O, S, Se or NH.

A preferred moiety $R_1$ is trifluoromethyl $CF_3$ and examples of such diketones are, banzoyltrifluoroacetone, p-chlorobenzoyltrifluoroacetone, p-bromotrifluoroacetone, p-phenyltrifluoroacetone, 1-naphthoyltrifluoroacetone, 2-naphthoyltrifluoroacetone, 2-phenathoyltrifluoroacetone, 3-phenanthoyltrifluoroacetone, 9-anthroyltrifluoroacetonetrifluoroacetone, cinnarnoyltrifluoroacetone, and 2-thenoyltrifluoroacetone.

The different groups Lα may be the same or different ligands of formulae

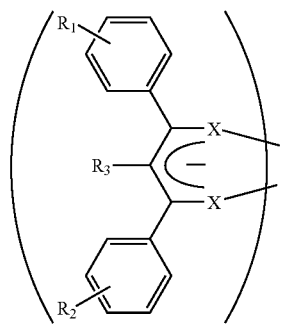

(VI)

where X is O, S, or Se and $R_1$ $R_2$ and $R_3$ are as above

The different groups Lα may be the same or different quinolate derivatives such as

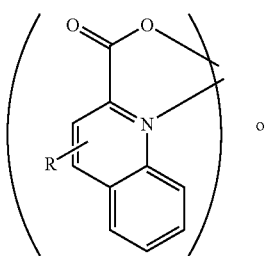

(VII)

or

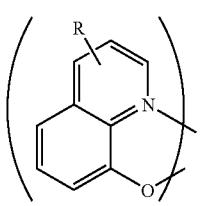

(VIII)

where R is hydrocarbyl, aliphatic, aromatic or heterocyclic carboxy, aryloxy, hydroxy or alkoxy e.g. the 8 hydroxy quinolate derivatives or

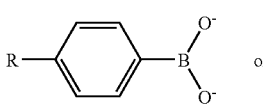

(IX)

or

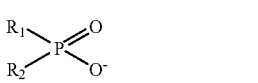

(X)

where R, $R_1$, and $R_2$ are as above or are H or F e.g. $R_1$ and $R_2$ are alkyl or alkoxy groups

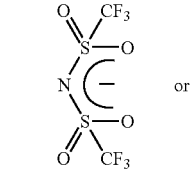

(XI)

or

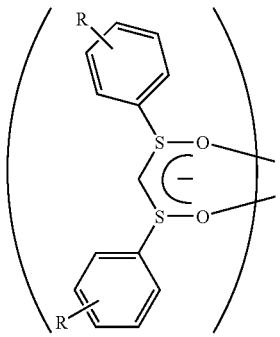

(XII)

As stated above the different groups Lα may also be the same or different carboxylate groups e.g.

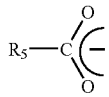
(XIII)

where $R_5$ is a substituted or unsubstituted aromatic, polycyclic or heterocyclic ring a polypyridyl group, $R_5$ can also be a 2-ethyl hexyl group so $L_n$ is 2-ethylhexanoate or $R_5$ can be a chair structure so that $L_n$ is 2-acetyl cyclohexanoate or Lα can be

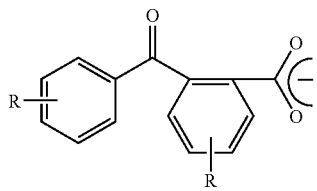
(XIV)

where R is as above e.g. alkyl, allenyl, amino or a fused ring such as a cyclic or polycyclic ring.

The different groups Lα may also be

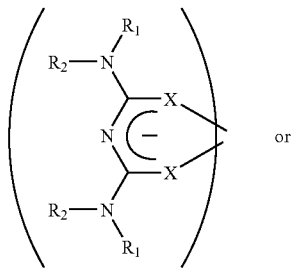
(XV)

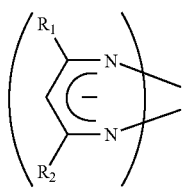
(XVI)

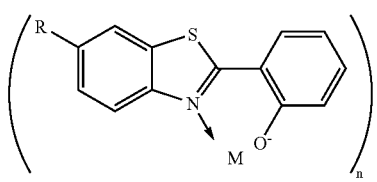
(XVII)

Where R, $R_1$ and $R_2$ are as above.

Examples of β-diketones are Tris-(1,3-diphenyl-1-3-propanedione) (DBM) and suitable metal complexes are $Al(DBM)_3$, $Zn(DBM)_2$ and $Mg(DBM)_2$, $Sc(DBM)_3$ etc.

A preferred β-diketone is when $R_1$ and/or $R_3$ are alkoxy such as methoxy and the metals are aluminium or scandium i.e. the complexes have the formula

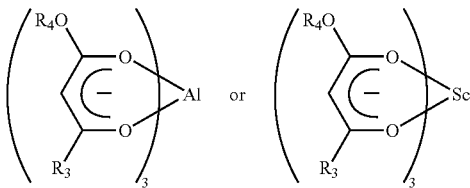

where $R_4$ is an alkyl group, preferably methyl and $R_3$ is hydrogen, an alkyl group such as methyl or $R_4O$.

There can be other ligands in place of some of the β-diketone complex such as

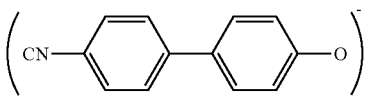

so that the electroluminescent compound has the formula $(L\alpha)_m(L_1)_n M$ where M is as defined above, (Lα) is a compound of formula

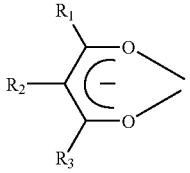

where $R_1$, $R_2$, and $R_3$ are as defined above, $L_2$ is another organic ligand, m+n equals the valency of M and m is at least 1.

When M is platinum or palladium the complex can be non-stoichiometric i.e. of formula $M_x L_y$, where M is the metal and L is a organic ligand. In a stoichiometric complex x will be one and y will be the valence state of the metal, in a non-stoichiometric complex x and y can have different values e.g. x is two and y is three, examples include $Pt_2(DBM)_3$ and $Pd_2(DBM)_3$ where Pt and Pd are nominally in the II valence state. It is possible that some kind of linked or polymeric structure is formed and/or the metal is present in more than one valence state.

Where the metal M is a metal with an unfilled inner orbital such as scandium, yttrium, niobium etc. there can be an uncharged ligand which forms a complex with the metal so the complex has the formula

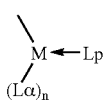

where M is as a metal with an unfilled inner orbital Lα is as above

The groups $L_p$ can be selected from

Figure 2A:
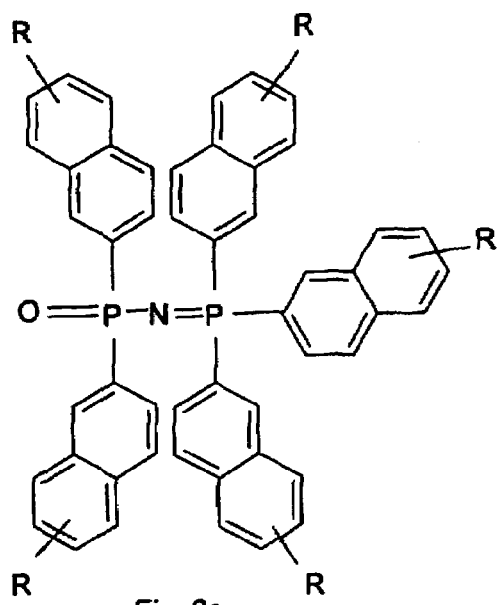
Figure 2B:
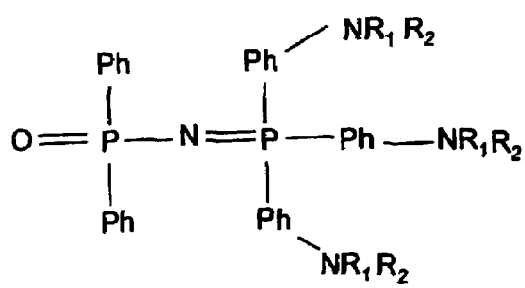

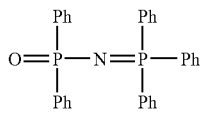
(XVIII)

Where each Ph which can be the same or different and can be a phenyl (OPNP) or a substituted phenyl group, other substituted or unsubstituted aromatic group, a substituted or unsubstituted heterocyclic or polycyclic group, a substituted or unsubstituted fused aromatic group such as a naphthyl, anthracene, phenanthrene or pyrene group. The substituents can be for example an alkyl, aralkyl, alkoxy, aromatic, heterocyclic, polycyclic group, halogen such as fluorine, cyano, amino. Substituted amino etc. Examples are given in FIGS. 1 and 2 of the drawings where R, $R_1$, $R_2$, $R_3$ and $R_4$ can be the same or different and are selected from hydrogen, hydrocarbyl groups, substituted and unsubstituted aromatic, heterocyclic and polycyclic ring structures, fluorocarbons such as trifluoryl methyl groups, halogens such as fluorine or thiophenyl groups; R, $R_1$, $R_2$, $R_3$ and $R_4$ can also form substituted and unsubstituted fused aromatic, heterocyclic and polycyclic ring structures and can be copolymerisable with a monomer e.g. styrene. R, $R_1$, $R_2$, $R_3$ and $R_4$ can also be unsaturated alkylene groups such as vinyl groups or groups

—C—CH$_2$=CH$_2$—R where R is as above.

$L_p$ can also be compounds of formulae

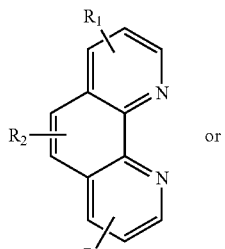
(XVIV)

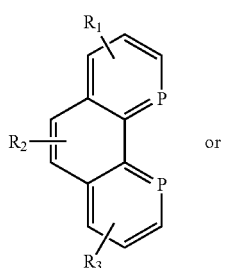
(XX)

Figure 3:
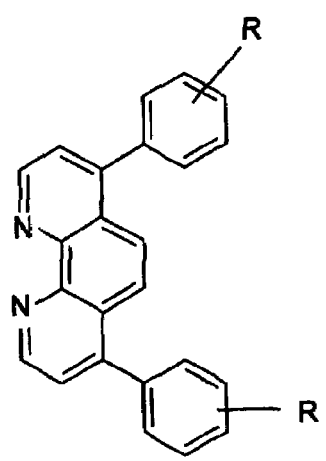
Figure 4A:
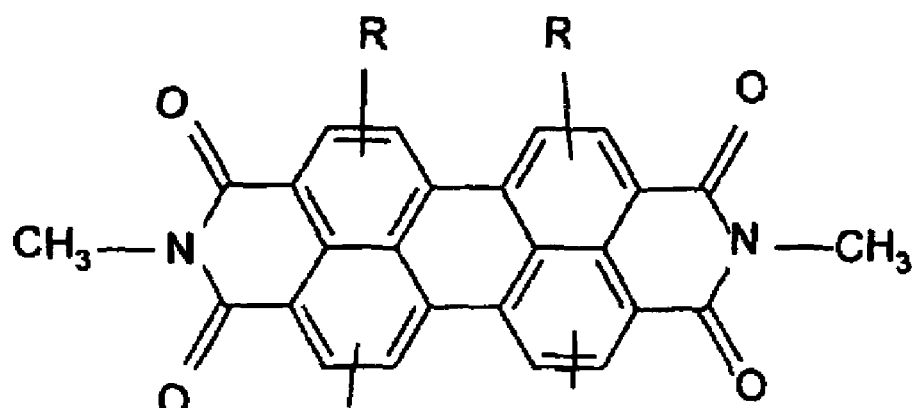
Figure 4B:
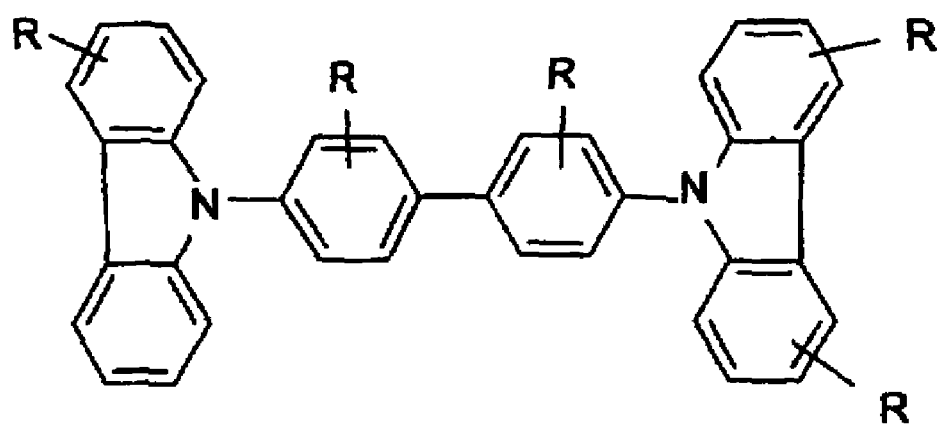
Figure 4C:
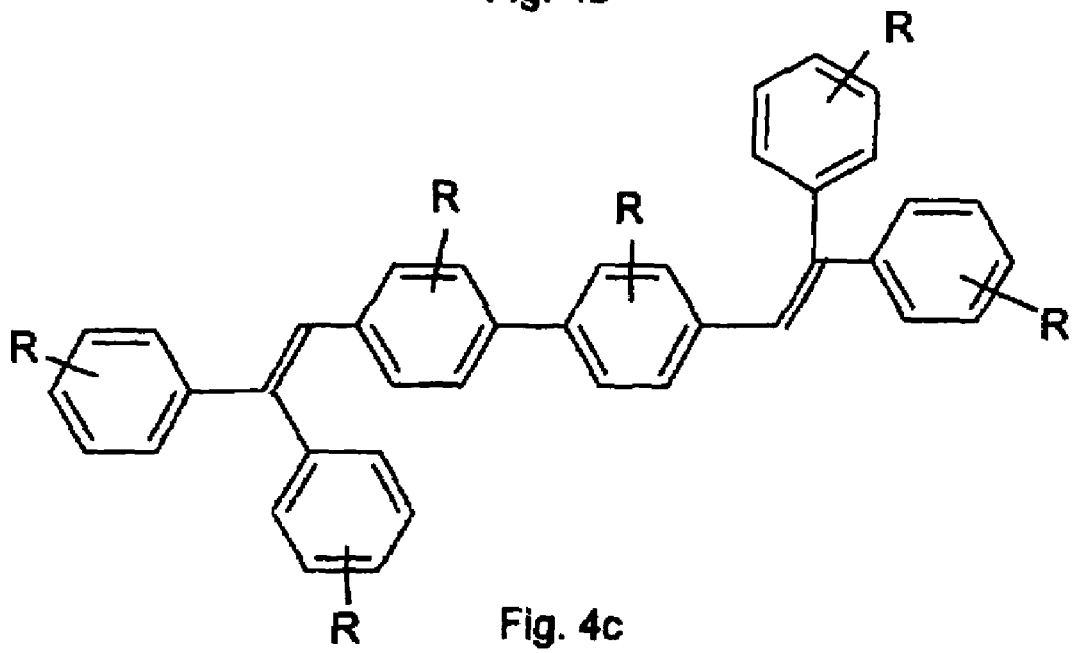
Figure 4D:
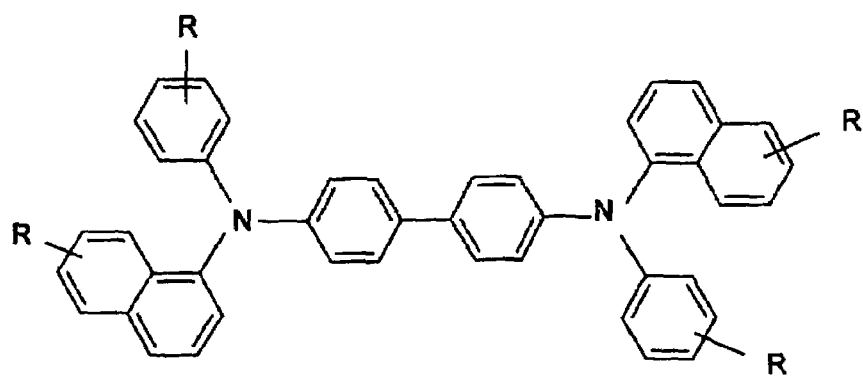
Figure 4E:
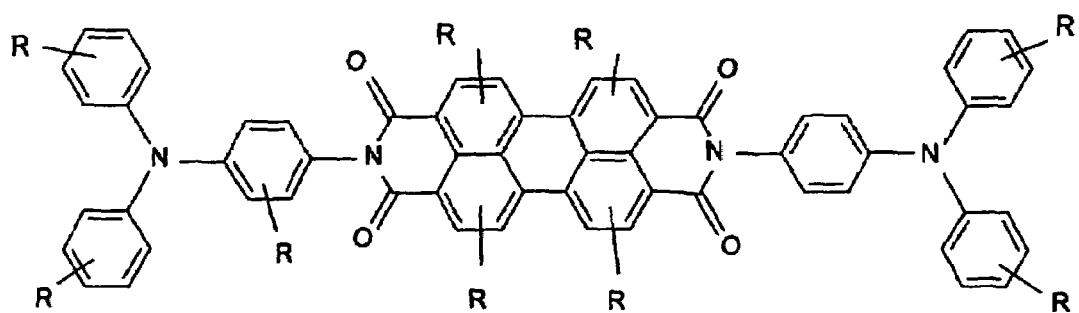
Figure 4F:
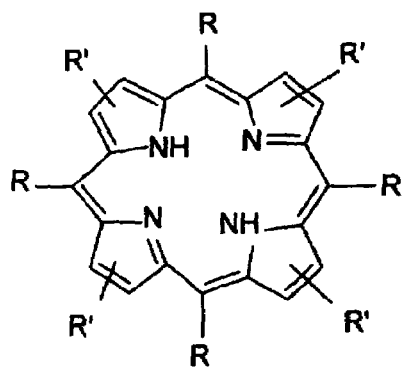
Figure 4G:
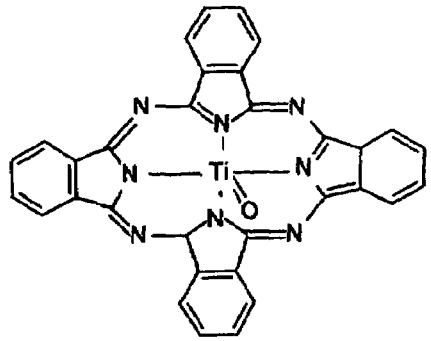
Figure 4H:
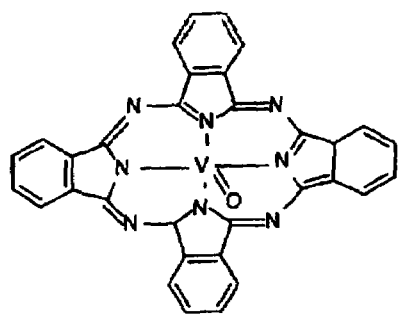
Figure 4I:
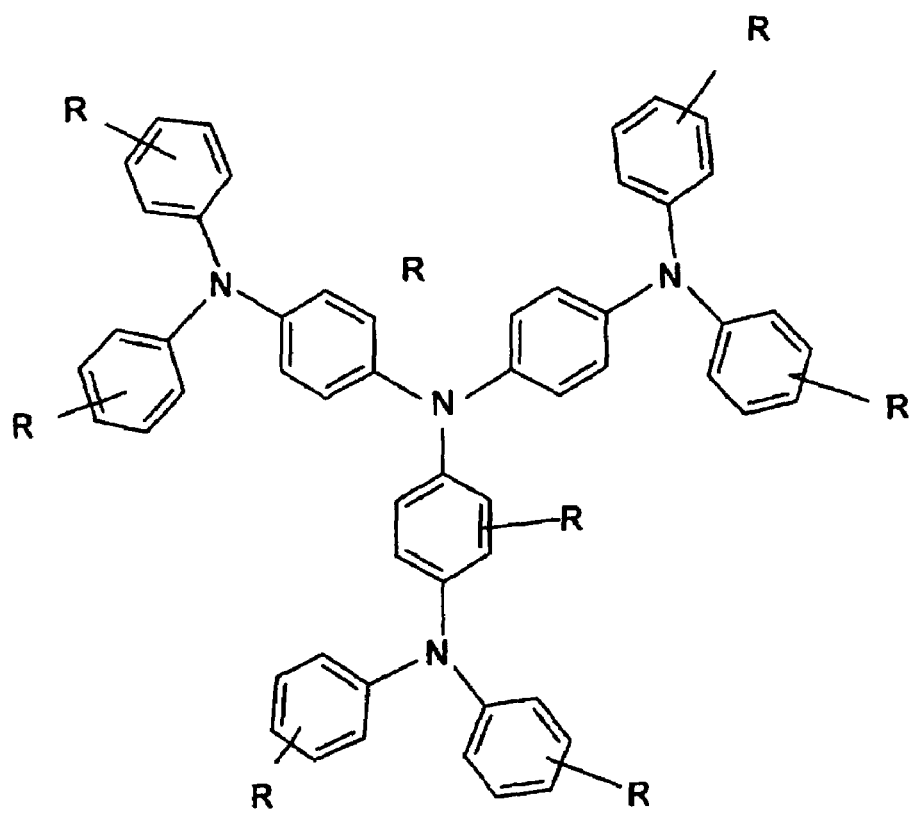
Figure 4J:
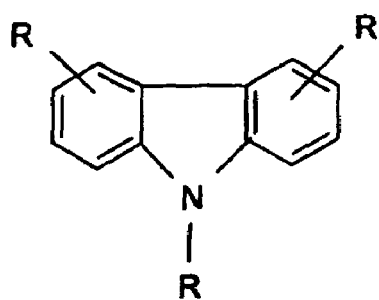
Figure 4K:
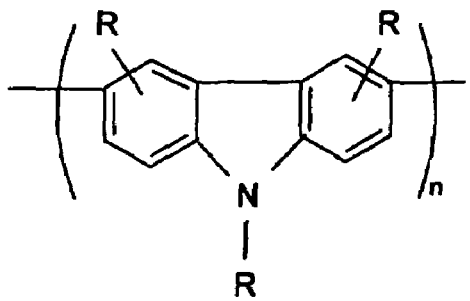
Figure 4L:
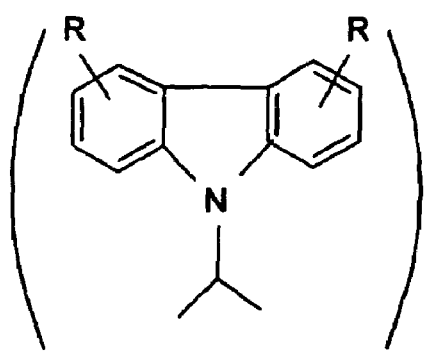
Figure 5A:
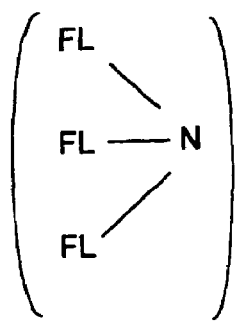
Figure 5B:
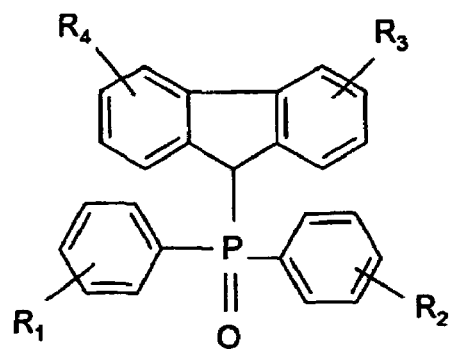
Figure 5C:
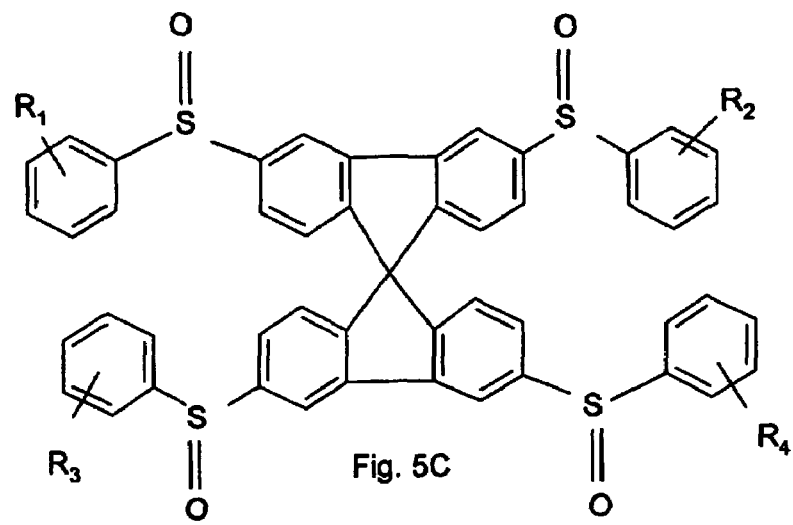
Figure 5D:
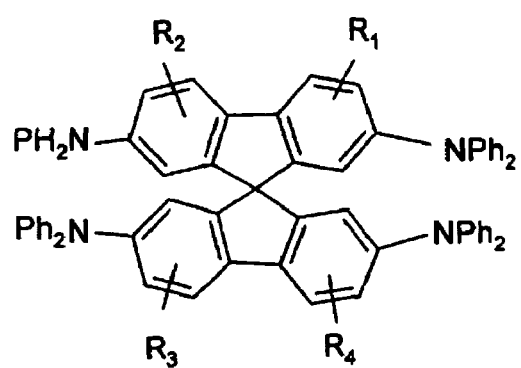
Figure 5F:
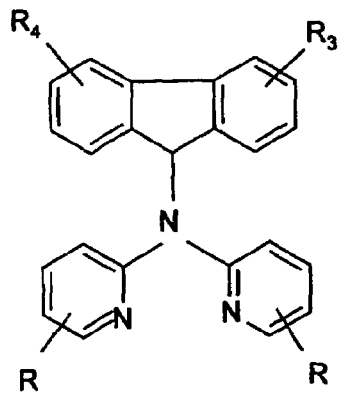
Figure 5G:
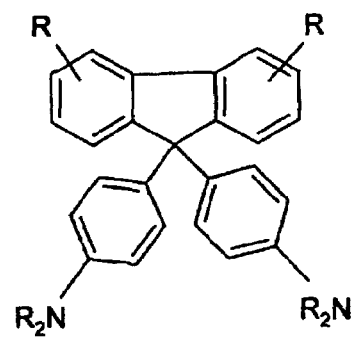
Figure 6A:
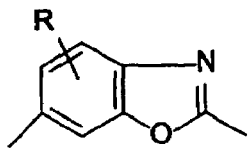
Figure 6B:
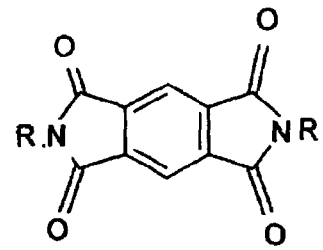
Figure 6C:
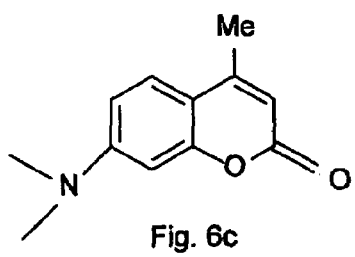
Figure 6D:
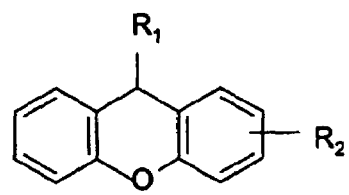
Figure 6E:
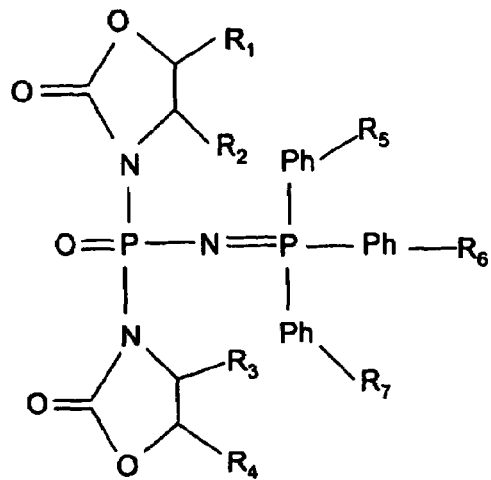
Figure 7A:
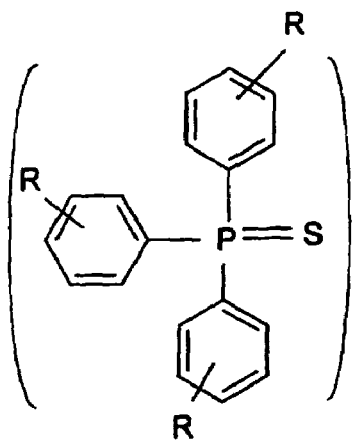
Figure 7B:
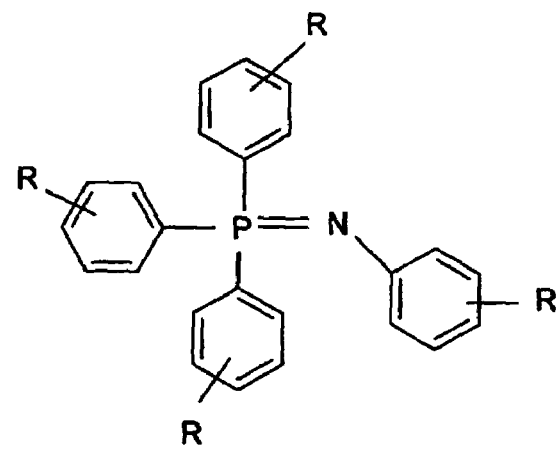
Figure 7C:
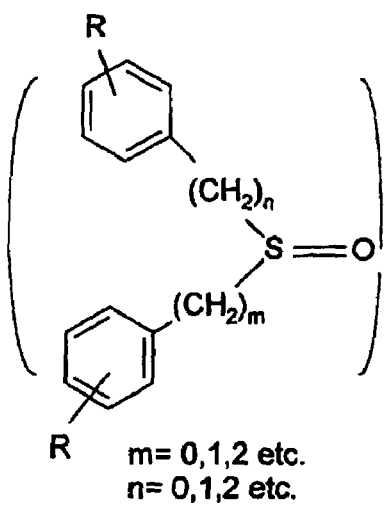
Figure 7D:
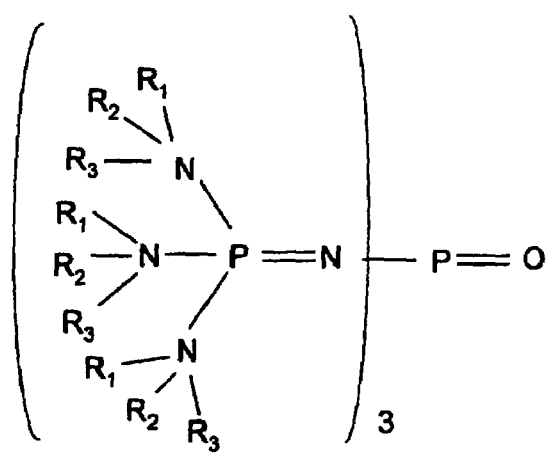
Figure 7E:
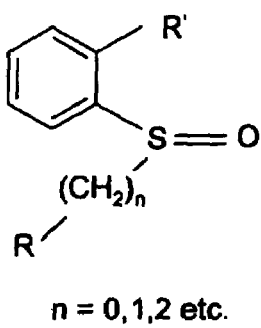
Figure 7F:
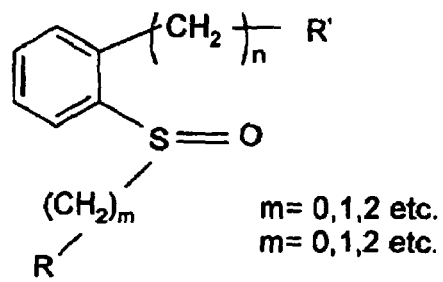
Figure 8A:
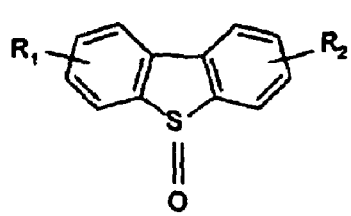
Figure 8B:
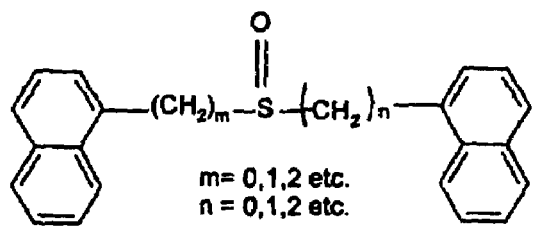
Figure 8C:
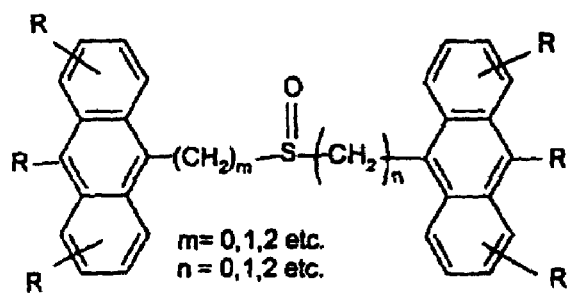
Figure 8D:
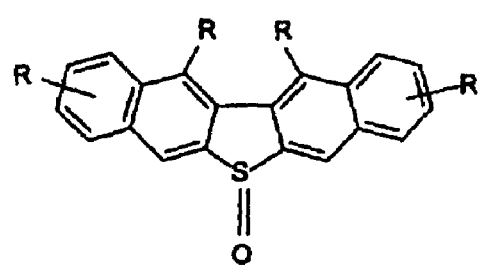
Figure 8E:
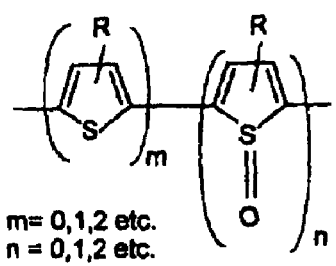
Figure 8F:
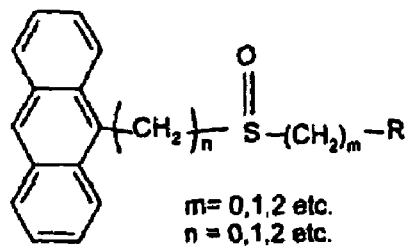
Figure 8G:
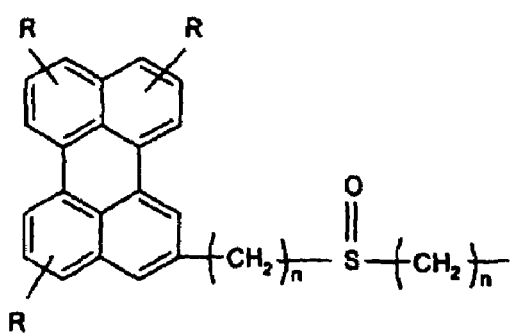
Figure 8H:
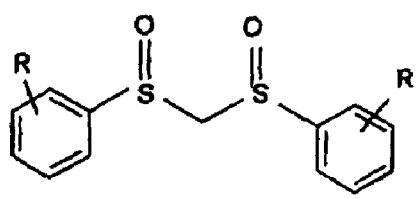
Figure 11:
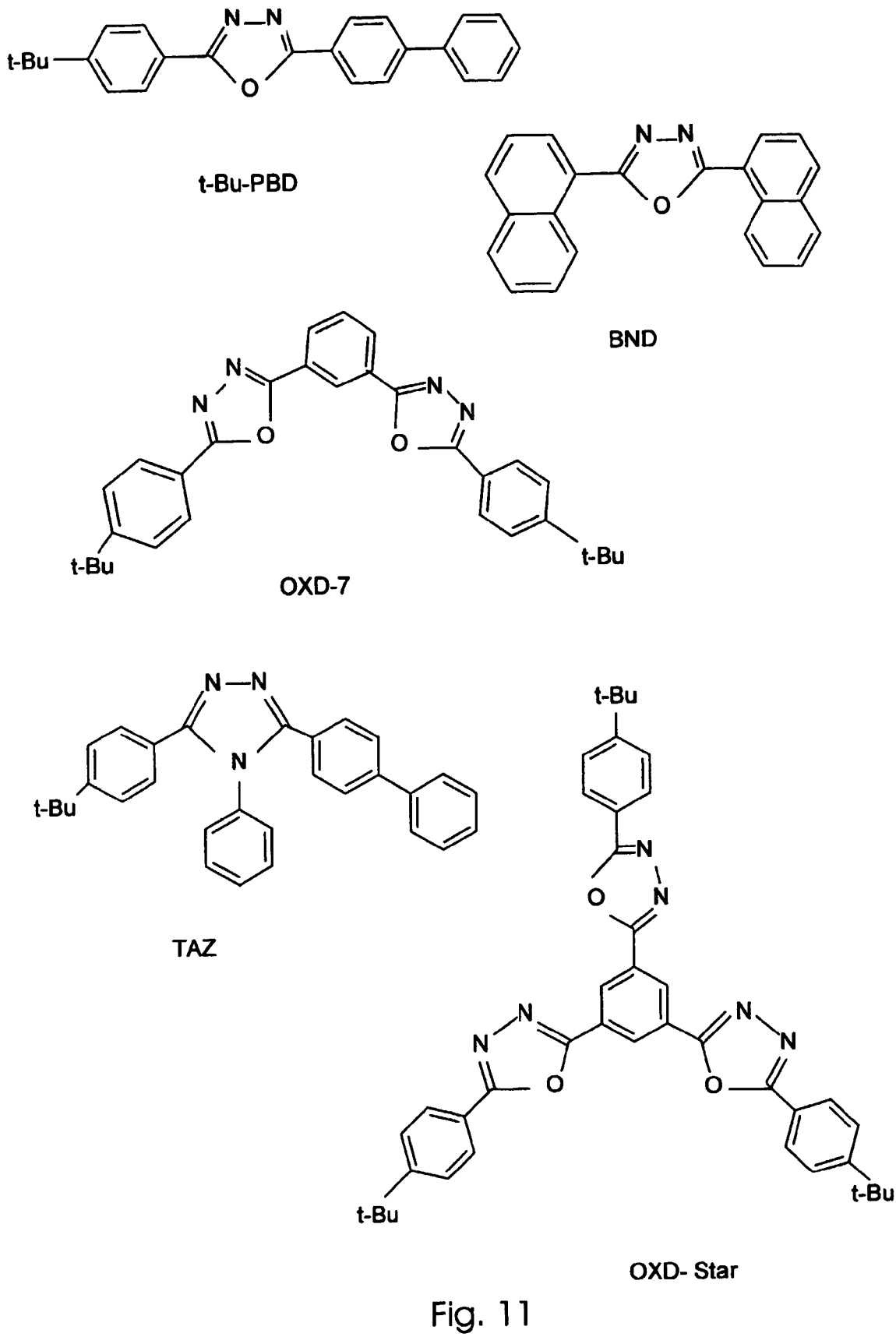
Figure 12A:
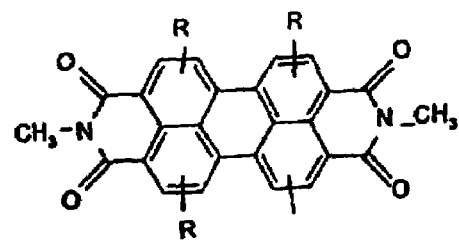
Figure 12B:
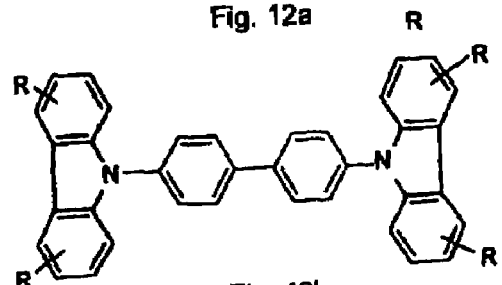
Figure 12C:
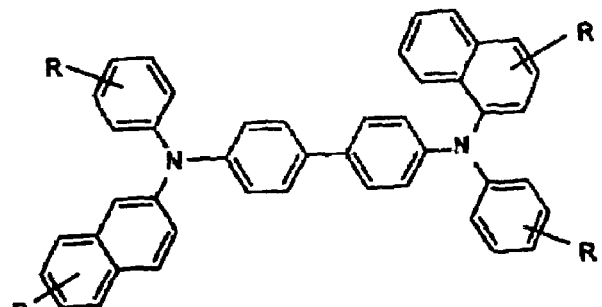
Figure 12D:
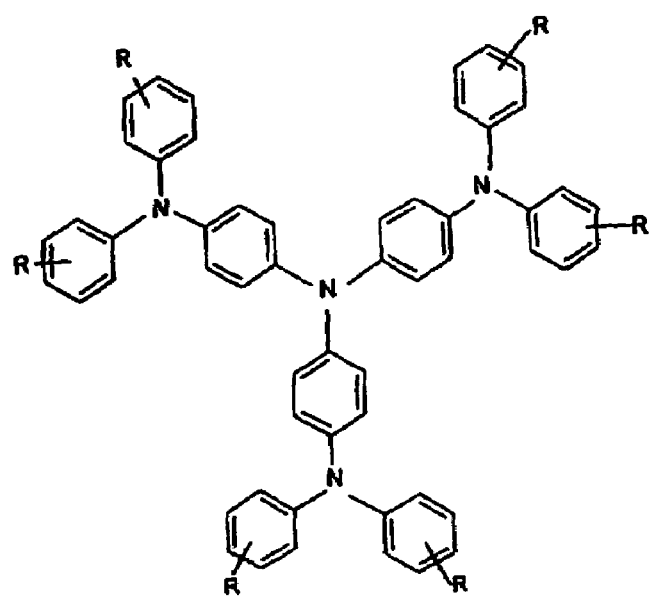
Figure 13A:
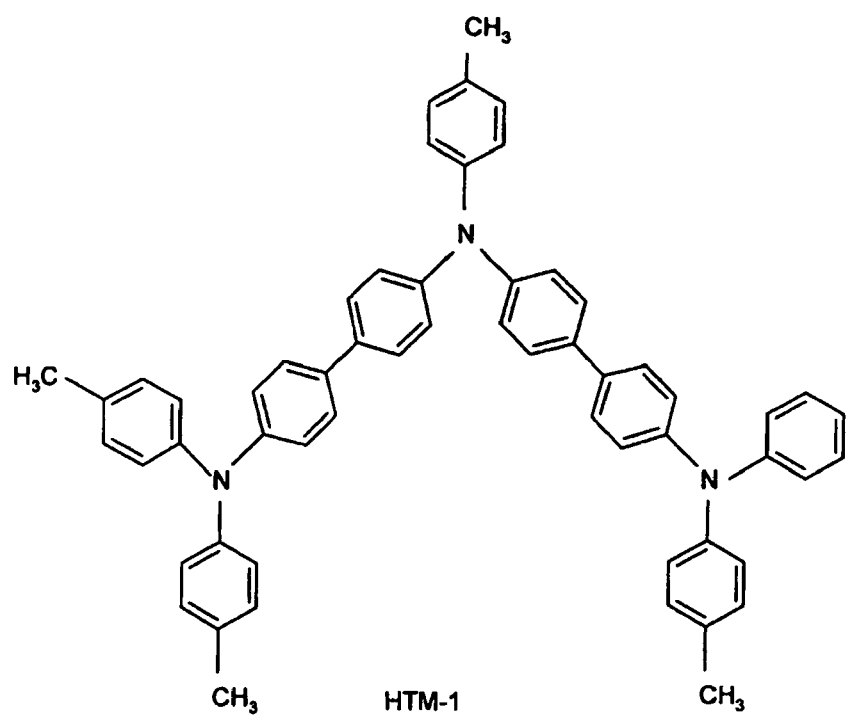
Figure 13B:
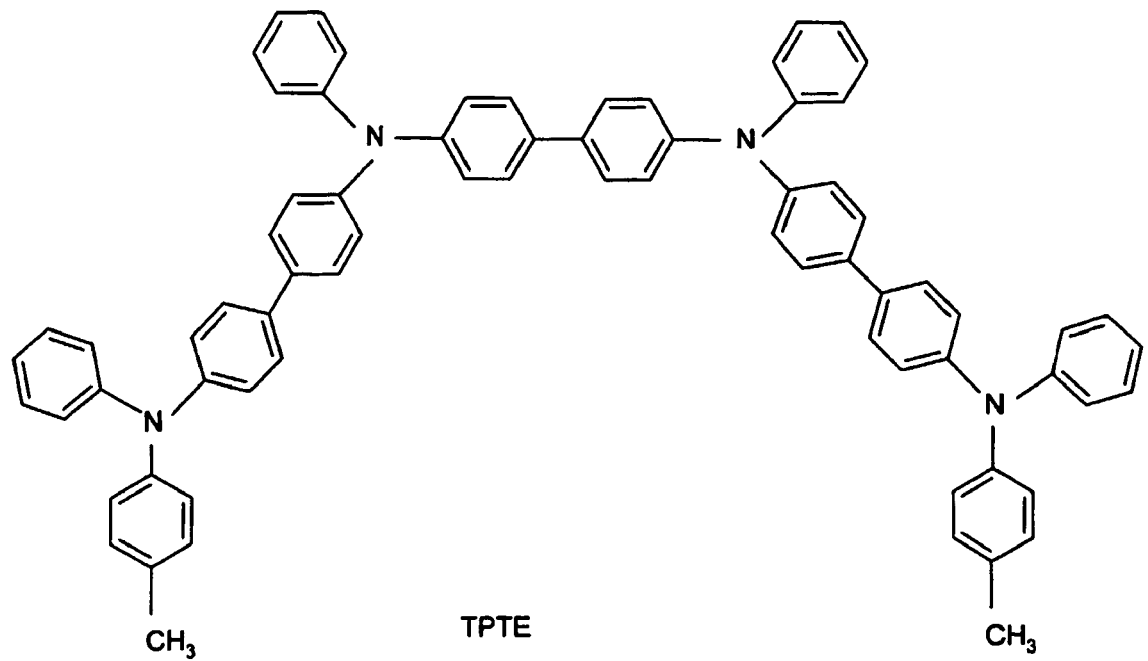
Figure 14:
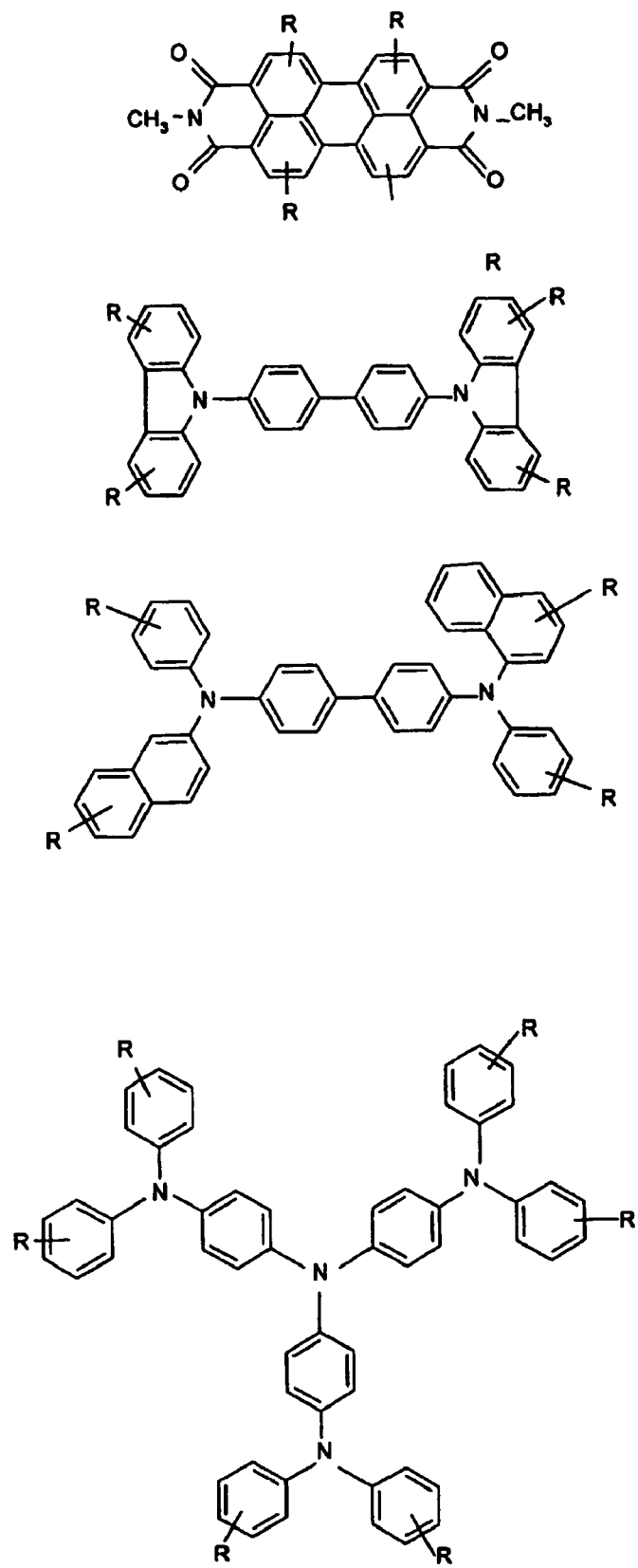
Figure 15:
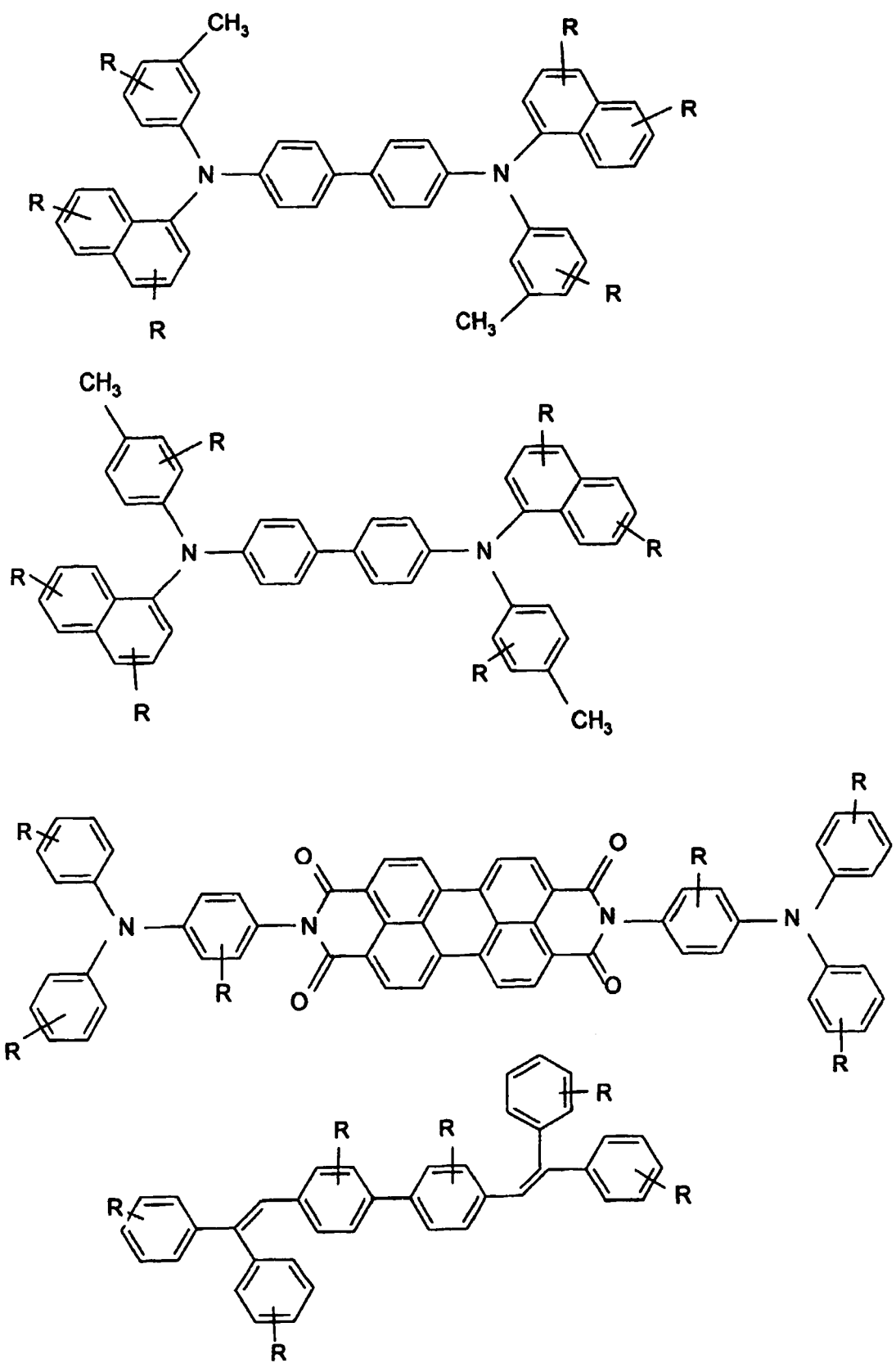

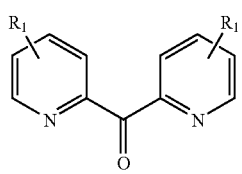
(XXI)

where $R_1$, $R_2$ and $R_3$ are as referred to above, for example bathophen shown in FIG. 3 of the drawings in which R is as above or

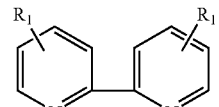
(XXII)

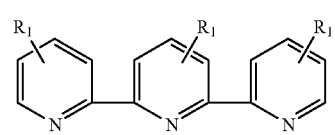
(XXIII)

where $R_1$, $R_2$ and $R_3$ are as referred to above.

$L_p$ can also be

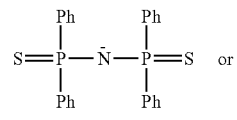
(XXIV)

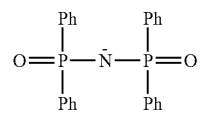
(XXV)

where Ph is as above.

Other examples of $L_p$ chelates are as shown in FIG. 4 and fluorene and fluorene derivatives e.g. a shown in FIG. 5 and compounds of formulae as shown as shown in FIGS. 6 to 8.

Specific examples of Lα and Lp are tripyridyl and TMHD, and TMHD complexes, α, α', α" tripyridyl, crown ethers, cyclans, cryptans phthalocyanans, porphoryins ethylene diamine tetramine (EDTA), DCTA, DTPA and TTHA. Where TMHD is 2,2,6,6-tetramethyl-3,5-heptanedionato and OPNP is diphenylphosphonimide triphenyl phosphorane. The formulae of the polyamines are shown in FIG. 9.

Preferably there is a hole transmitting layer deposited on the transparent substrate and the electroluminescent material is deposited on the hole transmitting layer. The hole transmitting layer serves to transport holes and to block the electrons, thus preventing electrons from moving into the electrode without recombining with holes. The recombination of carriers therefore mainly takes place in the emitter layer.

Hole transmitting layers are used in small molecule based polymer electroluminescent devices and in electroluminescent devices based on rare earth metal complexes and any of the known hole transmitting materials in film form can be used.

Hole transmitting layers are used in polymer electroluminescent devices and any of the known hole transmitting materials in film form can be used.

The hole transmitting layer can be made of a film of an aromatic amine complex such as poly (vinylcarbazole), N,N'-diphenyl-N,N'-bis(3-methylphenyl)-1,1'-biphenyl-4,4'-diamine (TPD), an unsubstituted or substituted polymer of an amino substituted aromatic compound, a polyaniline, substituted polyanilines, polythiophenes, substituted polythiophenes, polysilanes etc. Examples of polyanilines are polymers of

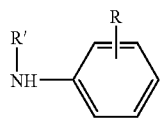
(II)

where R is in the ortho- or meta-position and is hydrogen, C1-18 alkyl, C1-6 alkoxy, amino, chloro, bromo, hydroxy or the group

where R is alkyl or aryl and R' is hydrogen, C1-6 alkyl or aryl with at least one other monomer of the formula immediately above.

Preferably evaporable de-protonated polymers of unsubstituted or substituted polymer of an amino substituted aromatic compound are used. The de-protonated unsubstituted or substituted polymer of an amino substituted aromatic compound can be formed by deprotonating the polymer by treatment with an alkali such as ammonium hydroxide or an alkali metal hydroxide such as sodium hydroxide or potassium hydroxide.

The degree of protonation can be controlled by forming a protonated polyaniline and de-protonating. Methods of preparing polyanilines are described in the article by A. G. MacDiarmid and A. F. Epstein, Faraday Discussions, Chem Soc. 88 P 319 1989.

The conductivity of the polyaniline is dependant on the degree of protonation with the maximum conductivity being when the degree of protonation is between 40 and 60% e.g. about 50% for example.

Preferably the polymer is substantially fully de-protonated

A polyaniline can be formed of octamer units i.e. p is four e.g.

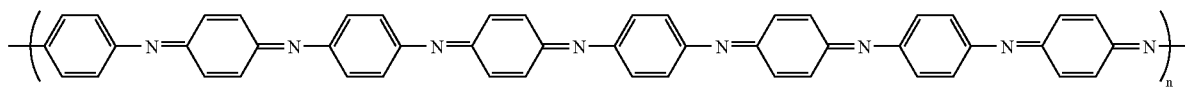

Polyanilines which can be used in the present invention have the general formula

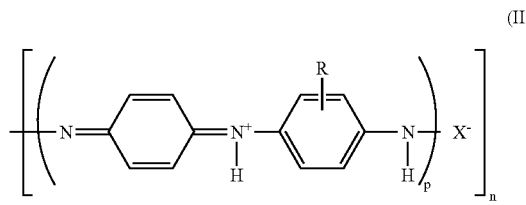
(III)

where p is from 1 to 10 and n is from 1 to 20, R is as defined above and X is an anion, preferably selected from Cl, Br, $SO_4$, $BF_4$, $PF_6$, $H_2PO_3$, $H_2PO_4$, arylsulphonate, arenedicarboxylate, polystyrenesulphonate, polyacrylate alkysulphonate, vinylsulphonate, vinylbenzene sulphonate, cellulosesulphonate, camphor sulphonates, cellulose sulphate or a perfluorinated polyanion.

Examples of arylsulphonates are p-toluenesulphonate, benzenesulphonate, 9,10-anthraquinone-sulphonate and anthracenesulphonate, an example of an arenedicarboxylate is phthalate and an example of arenecarboxylate is benzoate.

We have found that protonated polymers of the unsubstituted or substituted polymer of an amino substituted aromatic compound such as a polyaniline are difficult to evaporate or cannot be evaporated, however we have surprisingly found that if the unsubstituted or substituted polymer of an amino substituted aromatic compound is de-protonated it can be easily evaporated i.e. the polymer is evaporable.

The polyanilines can have conductivities of the order of $1 \times 10^{-1}$ Siemen $cm^{-1}$ or higher.

The aromatic rings can be unsubstituted or substituted e.g. by a C1 to 20 alkyl group such as ethyl.

The polyaniline can be a copolymer of aniline and preferred copolymers are the copolymers of aniline with o-anisidine, m-sulphanilic acid or o-aminophenol, or o-toluidine with o-aminophenol, o-ethylaniline, o-phenylene diamine or with amino anthracenes.

Other polymers of an amino substituted aromatic compound which can be used include substituted or unsubstituted polyaminonapthalenes, polyaminoanthracenes, polyaminophenanthrenes, etc. and polymers of any other condensed polyaromatic compound. Polyaminoanthracenes and methods of making them are disclosed in U.S. Pat. No. 6,153,726. The aromatic rings can be unsubstituted or substituted e.g. by a group R as defined above.

The polyanilines can be deposited on the first electrode by conventional methods e.g. by vacuum evaporation, spin coating, chemical deposition, direct electrodeposition etc. Preferably the thickness of the polyaniline layer is such that the layer is conductive and transparent and is preferably from 20 nm to 200 nm. The polyanilines can be doped or undoped. When they are doped they can be dissolved in a solvent and deposited as a film; when they are undoped they are solids and can be deposited by vacuum evaporation i.e. by sublimation.

The structural formulae of some other hole transmitting materials are shown in FIGS. 12, 13, 14, 15 and 16 of the drawings, where R, $R_1$, $R_2$ and $R_3$ can be the same or different and are selected from hydrogen, and substituted and unsubstituted hydrocarbyl groups such as substituted and unsubstituted aliphatic groups, substituted and unsubstituted aromatic, heterocyclic and polycyclic ring structures, fluorocarbons such as trifluoryl methyl groups, halogens such as fluorine or thiophenyl groups; $R_1$, $R_2$ and $R_3$ can also form substituted and unsubstituted fused aromatic, heterocyclic and polycyclic ring structures and can be copolymerisable with a monomer e.g. styrene. X is Se, S or O, Y can be hydrogen, substituted or unsubstituted hydrocarbyl groups, such as substituted and unsubstituted aromatic, heterocyclic and polycyclic ring structures, fluorine, fluorocarbons such as trifluoryl methyl groups, halogens such as fluorine or thiophenyl groups or nitrile.

Examples of $R_1$ and/or $R_2$ and/or $R_3$ include aliphatic, aromatic and heterocyclic alkoxy, aryloxy and carboxy groups, substituted and substituted phenyl, fluorophenyl, biphenyl, phenanthrene, anthracene, naphthyl and fluorene groups alkyl groups such as t-butyl, heterocyclic groups such as carbazole.

The hole transporting material can optionally be mixed with the electroluminescent material in a ratio of 5-95% of the electroluminescent material to 95 to 5% of the hole transporting compound.

Other hole transporting materials which can be used are conjugated polymers.

U.S. Pat. No. 5,807,627 discloses an electroluminescence device in which there are conjugated polymers in the electroluminescent layer. The conjugated polymers referred to are defined as polymers for which the main chain is either fully conjugated possessing extended pi molecular orbitals along the length of the chain or else is substantially conjugated, but with interruptions to conjugation, either random or regular along the main chain. They can be homopolymers or copolymers.

The conjugated polymer used can be any of the conjugated polymers disclosed or referred to in U.S. Pat. No. 5,807,627, PCT/WO90/13148 and PCT/WO92/03490.

The conjugated polymers disclosed are poly (p-phenylenevinylene)-PPV and copolymers including PPV. Other preferred polymers are poly(2,5 dialkoxyphenylene vinylene) such as poly(2-methoxy-5-(2-methoxypentyloxy-1,4-phenylene vinylene), poly(2-methoxypentyloxy)-1,4-phenylenevinylene), poly(2-methoxy-5-(2-dodecyloxy-1,4-phenylenevinylene) and other poly(2,5 dialkoxyphenylenevinylenes) with at least one of the alkoxy groups being a long chain solubilising alkoxy group, poly fluorenes and oligofluorenes, polyphenylenes and oligophenylenes, polyanthracenes and oligo anthracenes, ploythiophenes and oligothiophenes.

In PPV the phenylene ring may optionally carry one or more substituents e.g. each independently selected from alkyl, preferably methyl, alkoxy, preferably methoxy or ethoxy.

Any poly(arylenevinylene) including substituted derivatives thereof can be used and the phenylene ring in poly(p-phenylenevinylene) may be replaced by a fused ring system such as anthracene or naphthlyene ring and the number of vinylene groups in each polyphenylenevinylene moeity can be increased e.g. up to 7 or higher.

The conjugated polymers can be made by the methods disclosed in U.S. Pat. No. 5,807,627, PCT/WO90/13148 and PCT/WO92/03490.

The hole transmitting material and the light emitting metal compound can be mixed to form one layer e.g. in an proportion of 5 to 95% of the hole transmitting material to 95 to 5% of the light emitting metal compound.

Optionally there is a layer of an electron transmitting material between the cathode and the electroluminescent material layer, the electron transmitting material is a material which will transport electrons when an electric current is passed through electron transmitting materials include a metal complex such as a metal quinolate e.g. an aluminium quinolate, lithium quinolate a cyano anthracene such as 9,10 dicyano anthracene, a polystyrene sulphonate and compounds of formulae shown in FIG. 10. Instead of being a separate layer the electron transmitting material can be mixed with the electroluminescent material to form one layer e.g. in a proportion of 5 to 95% of the electron transmitting material to 95 to 5% of the light emitting metal compound.

The electroluminescent layer can comprise a mixture of the light emitting metal compound with the hole transmitting material and electron transmitting material The electroluminescent material can be deposited on the substrate directly by vacuum evaporation or evaporation from a solution in an organic solvent. The solvent which is used will depend on the material but chlorinated hydrocarbons such as dichloromethane and n-methyl pyrrolidone; dimethyl sulphoxide; tetra hydrofuran; dimethylformamide etc. are suitable in many cases.

Alternatively electroluminescent material can be deposited by spin coating from solution, or by vacuum deposition from the solid state e.g. by sputtering, or any other conventional method can be used.

Preferably the first electrode is a transparent substrate such as a conductive glass or plastic material which acts as the anode, preferred substrates are conductive glasses such as indium tin oxide coated glass, but any glass which is conductive or has a transparent conductive layer such as a metal or conductive polymer can be used.

Conductive polymers and conductive polymer coated glass or plastics materials can also be used as the substrate.

The second electrode functions as the cathode and can be any low work function metal e.g. aluminium, calcium, lithium, silver/magnesium alloys etc., aluminium is a preferred metal.

The display of the invention may be monochromatic or polychromatic. Electroluminescent rare earth chelate compounds are known which will emit a range of colours e.g. red, green, and blue light and white light and examples are disclosed in Patent Applications WO98/58037 PCT/GB98/01773, PCT/GB99/03619, PCT/GB99/04030, PCT/GB99/04024, PCT/GB99/04028, PCT/GB00/00268 and can be used to form OLEDs emitting those colours. Thus, a full colour display can be formed by arranging three individual backplanes, each emitting a different primary monochrome colour, on different sides of an optical system, from another side of which a combined colour image can be viewed. Alternatively, rare earth chelate electroluminescent compounds emitting different colours can be fabricated so that adjacent diode pixels in groups of three neighbouring pixels produce red, green and blue light. In a further alternative, field sequential colour filters can be fitted to a white light emitting display.

Either or both electrodes can be formed of silicon and the electroluminescent material and intervening layers of a hole transporting and electron transporting materials can be formed as pixels on the silicon substrate. Preferably each pixel comprises at least one layer of a rare earth chelate electroluminescent material and an (at least semi-) transparent electrode in contact with the organic layer on a side thereof remote from the substrate.

Preferably, the substrate is of crystalline silicon and the surface of the substrate may be polished or smoothed to produce a flat surface prior to the deposition of electrode, or electroluminescent compound. Alternatively a non-planarised silicon substrate can be coated with a layer of conducting polymer to provide a smooth, flat surface prior to deposition of further materials.

In one embodiment, each pixel comprises a metal electrode in contact with the substrate. Depending on the relative work functions of the metal and transparent electrodes, either may serve as the anode with the other constituting the cathode.

When the silicon substrate is the cathode an indium tin oxide coated glass can act as the anode and light is emitted through the anode. When the silicon substrate acts as the anode the cathode can be formed of a transparent electrode which has a suitable work function, for example by a indium zinc oxide coated glass in which the indium zinc oxide has a low work function. The anode can have a transparent coating of a metal formed on it to give a suitable work function. These devices are sometimes referred to as top emitting devices or back emitting devices.

The metal electrode may consist of a plurality of metal layers, for example a higher work function metal such as aluminium deposited on the substrate and a lower work function metal such as calcium deposited on the higher work function metal. In another example, a further layer of conducting polymer lies on top of a stable metal such as aluminium.

Preferably, the electrode also acts as a mirror behind each pixel and is either deposited on, or sunk into, the planarised surface of the substrate. However, there may alternatively be a light absorbing black layer adjacent to the substrate.

In still another embodiment, selective regions of a bottom conducting polymer layer are made non-conducting by exposure to a suitable aqueous solution allowing formation of arrays of conducting pixel pads which serve as the bottom contacts of the pixel electrodes.

As described in WO00/60669 the brightness of light emitted from each pixel is preferably controllable in an analogue manner by adjusting the voltage or current applied by the matrix circuitry or by inputting a digital signal which is converted to an analogue signal in each pixel circuit. The substrate preferably also provides data drivers, data converters and scan drivers for processing information to address the array of pixels so as to create images. When an electroluminescent material is used which emits light of a different colour depending on the applied voltage the colour of each pixel can be controlled by the matrix circuitry.

In one embodiment, each pixel is controlled by a switch comprising a voltage controlled element and a variable resistance element, both of which are conveniently formed by metal-oxide-semiconductor field effect transistors (MOSFETs) or by an active matrix transistor.

The electroluminescent materials of the present invention can generate electromagnetic radiation in the visible and in the infra red and ultra violet region of the spectrum e.g. 2200 nm to 200 nm, depending on the metal and the ligand.

Wavelengths in the near infra red region of the spectrum (e.g. 1100 nm to 2200 nm) are useful in the transmission of signals down optic fibres and the devices of the present invention can be used to transmit data down such optic fibres.

The invention is described with reference to the following Examples.

EXAMPLE 1

Preparation of Al(DBM)$_3$

Tris-(1,3-diphenyl-1-1-propanedione) Aluminium (III), Al(DBM)$_3$ was synthesised according to the reaction

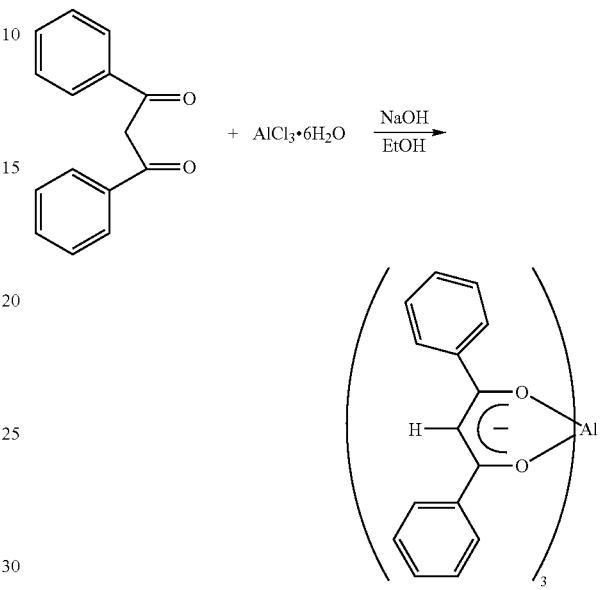

Dibenzoyl methane (2.78 g: 0.012 mole) was dissolved in ethanol (75 ml) by warming the solution. Sodium hydroxide (0.49 g; 0.012 mole) in water (15 ml) was added to the solution. The light yellow coloured solution was stirred for 15 minutes and a solution of AlCl$_3$.6H$_2$O (1.0 g: 0.004 mole) in water (15 ml) was slowly added, The reaction mixture was magnetically stirred and heated at 60° C. for 3 hours and allowed to cool to room temperature. The yellow pecipitate was filtered off under suction, washed with water, followed by ethanol and dried under vacuum at 80° C. for 4 hours. The product was further purified by dissolving in diethylether and precipitating with petroleum ether (40-60° C.). The product was filtered off under suction and dried under vacuum for 8 hours at 80° C.

The product was purified by being dissolved in diethylether/petether and allowed to form a precipitate, elemental analysis of the product showed it had a composition of 77.24% C and 4.79% H; the theoretical composition for Al(DBM)$_3$ is 77.58% C and 4.77% H.

The purified product was sublimed under vacuum at $10^{-5}$ Torr and chemical analysis showed that no decomposition of Al(DBM)$_3$ took place so that it could be used to form electroluminescent devices by vacuum coating.

The optical properties were measured by UV/visible absorbance spectra of solution evaporated thin film (SETF) and vacuum evaporated (VETF) Al(DBM)$_3$, and the results shown in Table 1.

TABLE 1

|  | SETF - $\lambda_{max}$/nm | VETF - $\lambda_{max}$/nm |
| --- | --- | --- |
| Al(DBM)$_3$ | 265, 371 | 260, 370 |

The $\lambda_{max}$ value of Al(DBM)$_3$ VET film and SET film are almost same. Therefore UV/Visible light data also proved that no decomposition of Al(DBM)$_3$ takes place in evaporation under vacuum.

Device Fabrication and Characterisation

Figure 17:
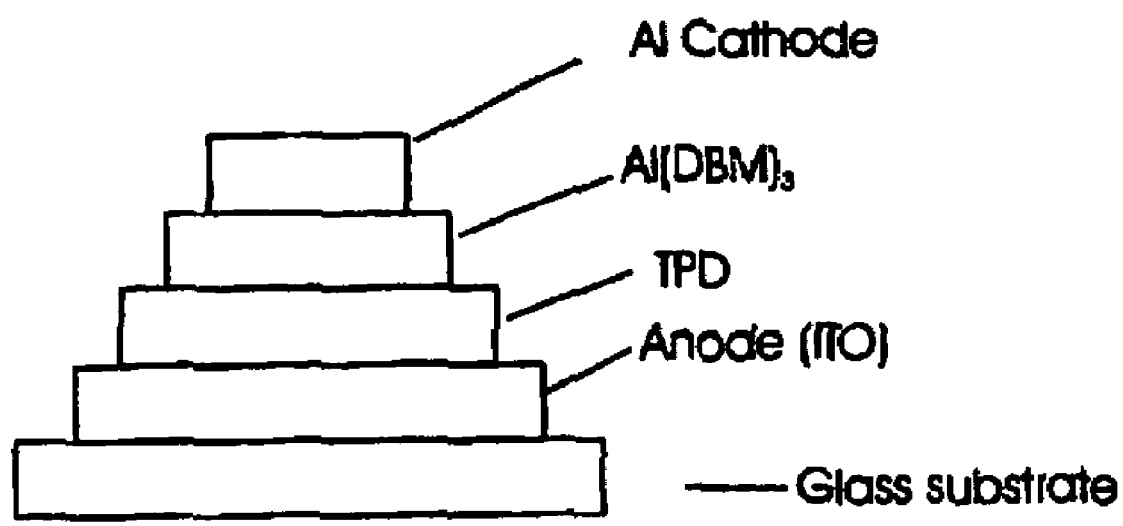
FIG. 17 is a diagrammatic section of an exemplary LED cell as described in this application.

A double layer device as illustrated in FIG. 17 was constructed, in the device the ITO coated glass had a resistance of about 10 ohms. An ITO coated glass piece (1×1 cm$^2$) had a portion etched out with concentrated hydrochloric acid to remove the ITO and was cleaned and dried. The device was fabricated by sequentially forming on the ITO, by vacuum evaporation at 1×10$^{-5}$ Torr, a TPD hole transmitting layer and the electroluminescent layer.

Figure 18:
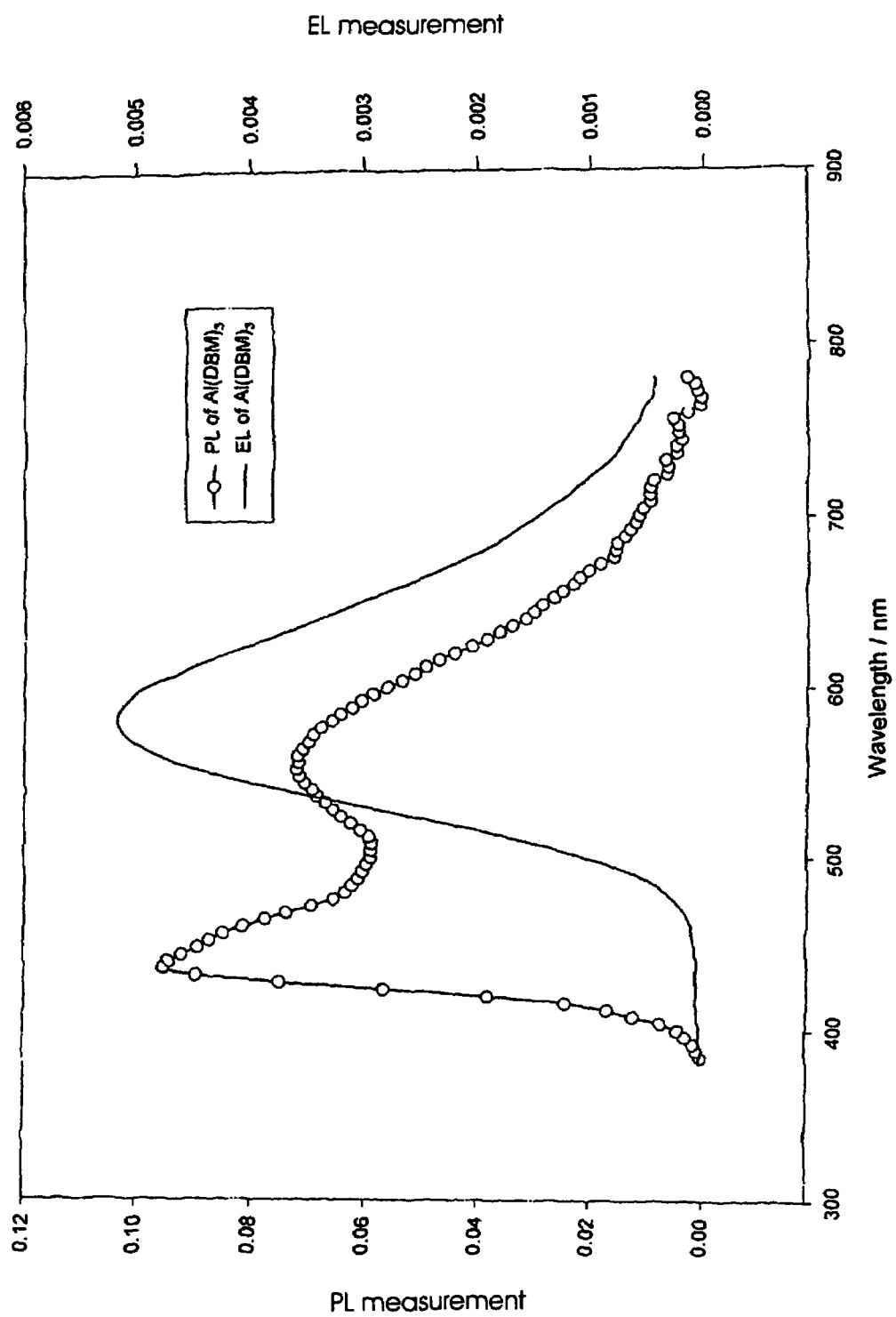
FIG. 18 is a plot of photoiwninescence and electroluminescence against wavelength for the device of Example 1 as described in this application.
Figure 19:
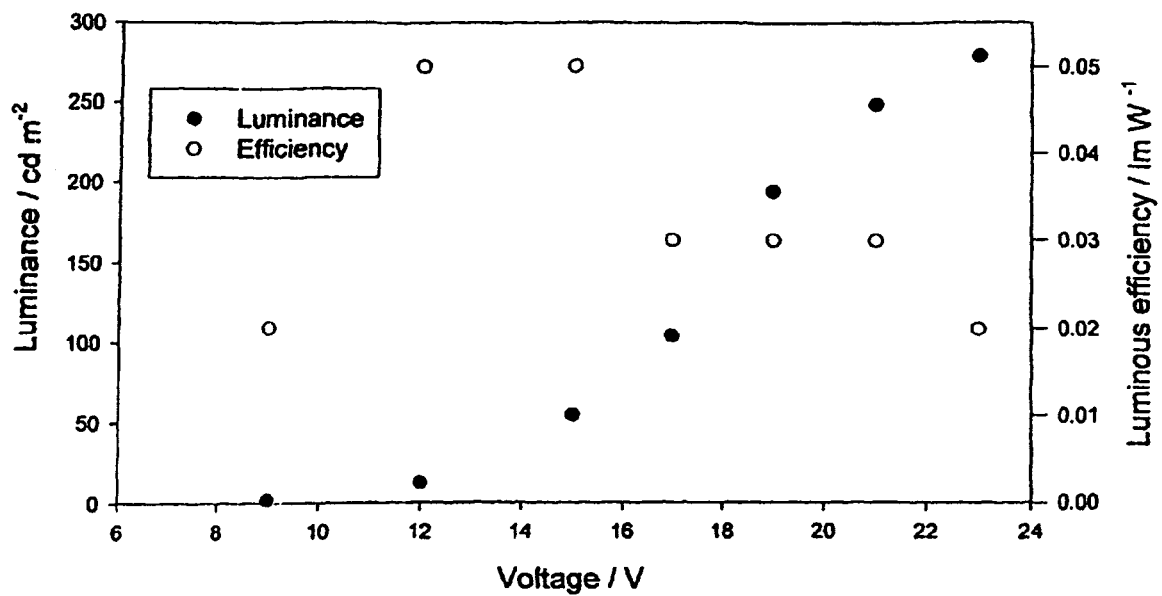
FIG. 19 is a plot of luminance and luminous efficiency against voltage for the device of Example 1 as described in this application.
Figure 20:
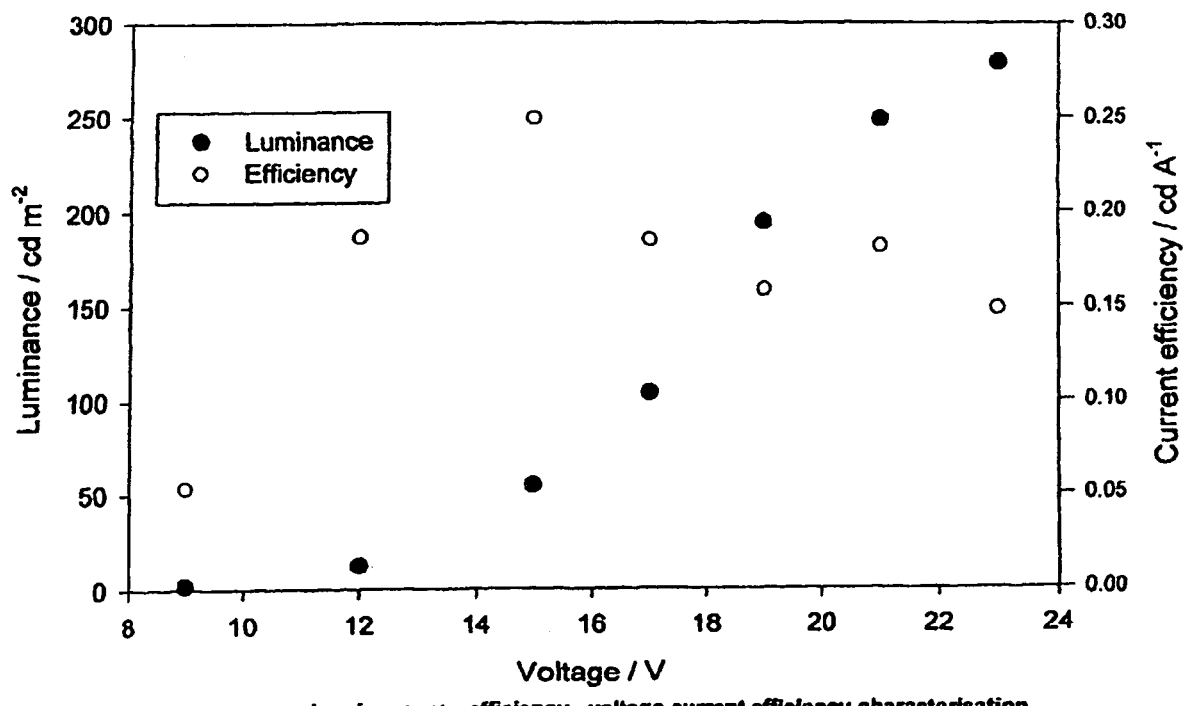
FIG. 20 is a plot of luminance and current efficiency against voltage for the device of Example 1 as described in this application.

The photoluminescent and electroluminescent spectra at 12 volts are shown in FIG. 18. The onset of luminescence was at about 4 volts showing as a bright saturated yellow luminescence with colour coordinates 0.5, 0.49. The luminescence increases with increasing voltage and the spectrum of FIG. 18 was recorded when luminescence was 12.6 cd m$^{-2}$ (12 volts, 6.75 mA cm$^{-2}$. The luminescence, voltage, current density and luminescence efficiency, voltage, current efficiency characterisation of the device is shown in FIGS. 19 and 20. A maximum luminance of about 279 cd m$^{-2}$ was observed at a current density of 87 mA cm$^{-2}$ and a driving voltage of 23 volts and at this voltage a luminance of 0.15 cd A$^{-1}$ and 0.02 lm W$^{-1}$ was obtained.

The luminescence, current density, luminescent efficiency and the luminescence, current density, current efficiency characterizations are shown in FIGS. 21 and 22. The maximum luminescence efficiency of 0.05 lm W$^{-1}$ at 15 volts, current efficiencies of 0.25 cd A$^{-1}$ (21 mA cm$^{-2}$) and a brightness of 5 cd m$^{-2}$ were obtained. The change in CIE colour coordinates with voltage is shown in Table 2.

TABLE 2

| V | Cd m$^{-2}$ | x: | Y: |
|---|---|---|---|
| 9 | 2 | 0.50 | 0.48 |
| 12 | 12.6 | 0.50 | 0.49 |
| 15 | 55 | 0.49 | 0.49 |
| 17 | 104 | 0.49 | 0.49 |
| 19 | 194 | 0.48 | 0.49 |
| 21 | 249 | 0.48 | 0.49 |
| 23 | 279 | 0.48 | 0.49 |

EXAMPLE 2

Preparation of Mg(DBM)$_2$

Figure 23:
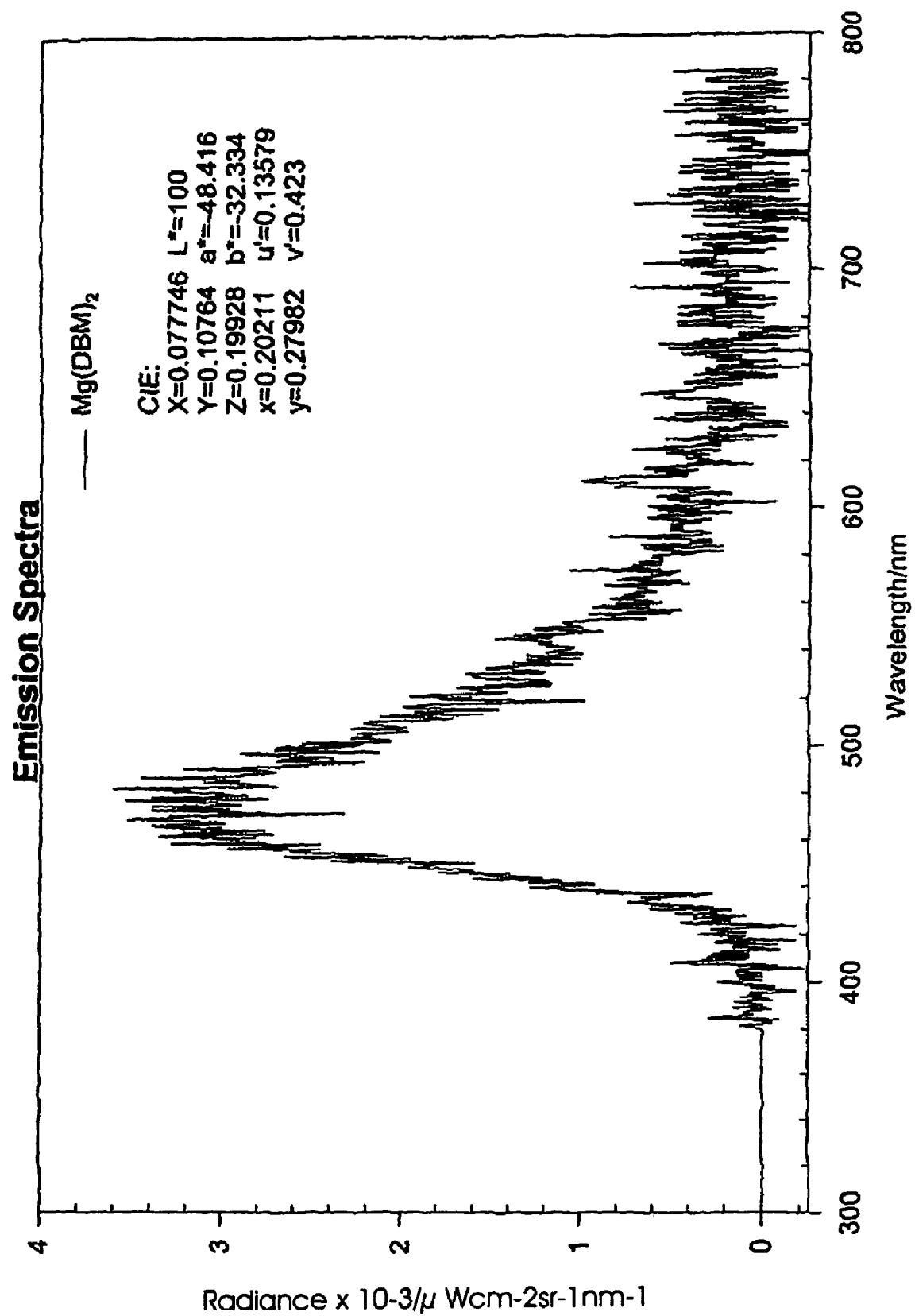
FIG. 23 is a plot of radiance against wavelength for the device of Example 2 as described in this application.

Dibenzoylmethane (10.9 g; 0.049 mole) was dissolved in ethanol (100 ml) by warming the solution. MgCl$_2$ (5.0 g; 0.025 mole) in water (10 ml) was added followed by 2N NaOH solution until the pH was 6-7. The precipitate was heated at 60° C. for 2 hours, cooled and filtered off under suction. The precipitate was washed thoroughly with water, followed by ethanol and diethyl ether. The product dried under vacuum oven at 80° C. for 6 hours and the emission spectra shown in FIG. 23.

EXAMPLE 3

Preparation of Sc(DBM)$_3$

Dibenzoylmethane (13.5 g; 0.061 mole) was dissolved in ethanol (125 ml) by warming the solution to 60° C. Small amounts of NaOH (10% solution) was first added to the DBM solution. The solution became light yellow in colour. ScCl$_3$.H$_2$O (3.0 g; 0.020 mole) in water(10 ml) was added. A light yellow precipitate formed immediately. The NaOH solution was further added until the pH of the mixture was between 7-8. The reaction mixture was stirred and heated at 60° C. for 1 hour, cooled and filtered off under suction. The precipitate was again taken-up in ethanol (150 ml) and refluxed for 1 hour. The product was allowed to cool and filtered off under suction and dried under vacuum at 90° C. for about 6 hours

EXAMPLE 4

Preparation of Zn(DBM)$_2$

Figure 24:
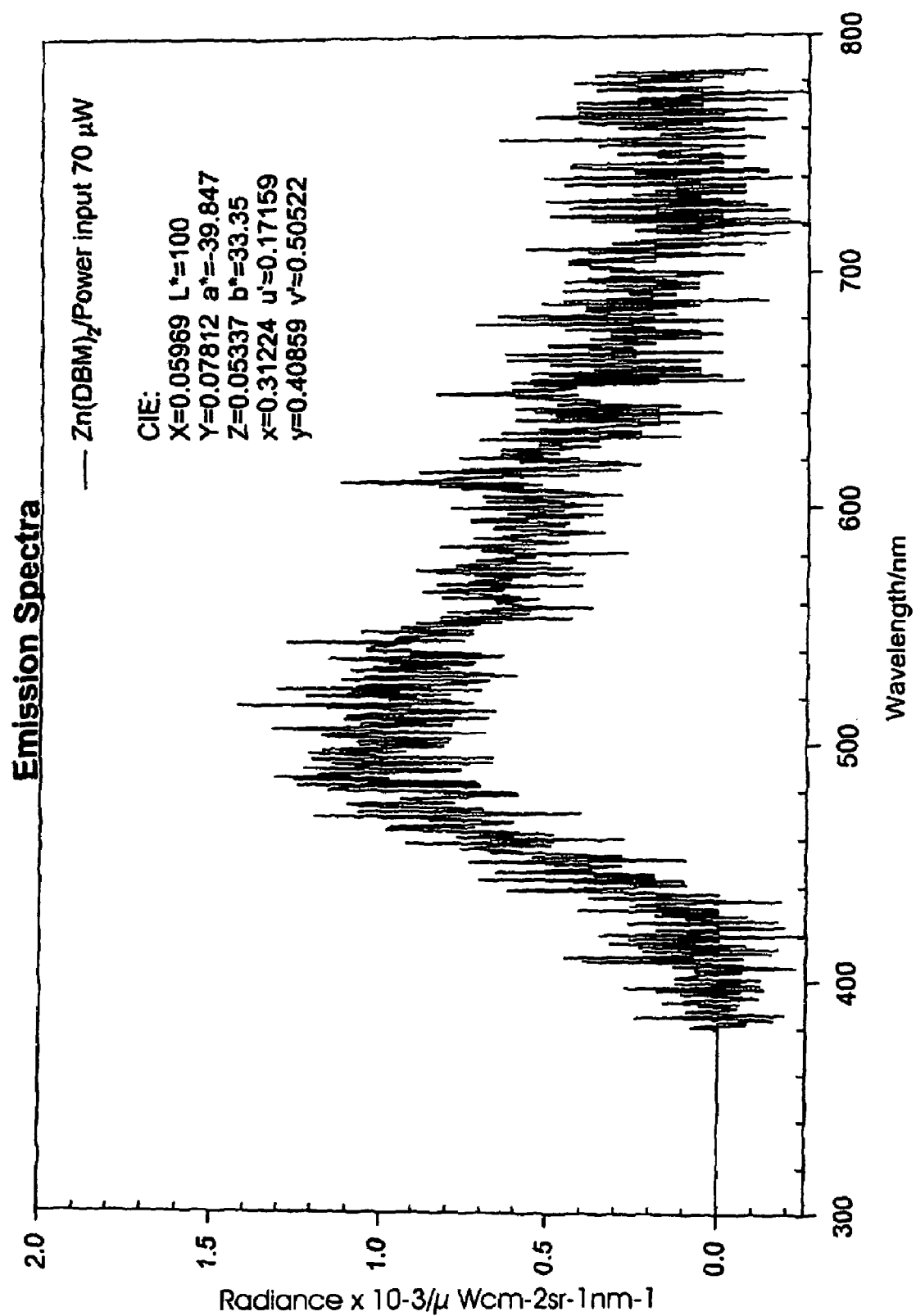
FIG. 24 is a plot of radiance against wavelength for the device of Example 4 as described in this application.

Dibenzoylmethane (25.0 g; 0.11 mole) was dissolved in ethanol (200 ml) by warming the solution ZnCl$_2$ (7.5 g, 0.055 mole) in water (10 ml) was added followed by 2N NaOH solution until the pH was 7. The light yellow precipitate was warmed for 1 hour and cooled to room temperature. The light yellow precipitate was filtered off, washed thoroughly with water followed by ethanol and dried under vacuum at 80° C. for 10 hours. It exhibited bluish-white fluorescence and the emission spectra shown in FIG. 24.

The photoluminescence spectra were studied using a 100 mg disc and a vacuum evaporated thin film and the results shown in Table 3

TABLE 3

| Material | PL $\lambda$max/nm | (x, y) | $\eta$/% |
|---|---|---|---|
| Al(DBM)$_3$ | 442,565 | (0.34, 0.36) | 15 ± 3 |
| Zn(DBM)$_2$ | 500 | (0.31, 0.41) | 4 ± 1 |
| Mg(DBM)$_2$ | 473 | (0.20, 0.28) | 1 ± 0.5 |
| Sc(DBM)$_3$ | 586 | (0.48, 0.48) | 35 ± 5 |

EXAMPLE 5

Preparation of Aluminium (1,3-Bis-(4-methoxy-phenyl)-propane-1,3 dione)

The anion of 1,3-bis-(4-methoxy-phenyl)-propane-1,3 dione was prepared by addition of equimolar amounts of NaOH (3.5 mM in 10 ml water) to an ethanolic solution of 1,3-bis-(4-methoxy-phenyl)-propane-1,3 dione (3.5 mM in 50 ml ethanol) at 60° C. Introduction of aqueous solution of AlCl$_3$.6H$_2$0 (1. mM in 15 ml water) to the anion mixture afforded the desired complex as a pale yellow powder after stirring for 3 hours at 60° C. The compound was suction filtered and thoroughly washed with water. Then it was followed by a small amount of ethanol. It was dried at 75° C. for 8 hours mp 310° C. Yield: 75%. Elemental analysis of Al complex found C, 69.80; H, 5.26% Calc. for Al(C$_{51}$H$_{45}$O$_{12}$): C, 69.86; H, 5.13%

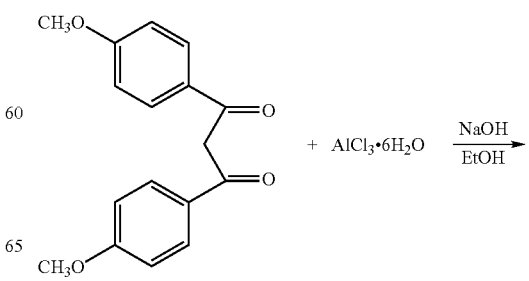

-continued

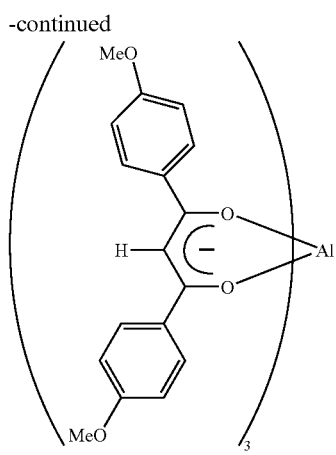

An electroluminescent was fabricated as in Example 1 and the colour coordinates of the emitted light were x=0.21, y=0.22 and $\lambda_{max}$ (emission) was 460 nm.

EXAMPLE 6

Preparation of Aluminium (1-(4-methoxy-phenyl)-propane-1,3 dione)

The anion of 1-(4-methoxy-phenyl)-3-phenyl-propane-1,3 dione was prepared by the addition of equimolar amounts of NaOH (3.9 mM in 15 ml water) to an ethanolic solution of li-(4-methoxy-phenyl)-3-phenyl-propane-1,3 dione (3.9 mM in 50 ml ethanol) at 60° C. The introduction of aqueous solution of AlCl$_3$.6H$_2$O (1.3 mM in 20 ml water) to the anion mixture afforded the desired complex as a pale yellow powder after stirring for 3 hours at 60° C. The compound was suction filtered and thoroughly washed with water followed by a small amount of ethanol. It was dried at 75° C. for 8 hours.

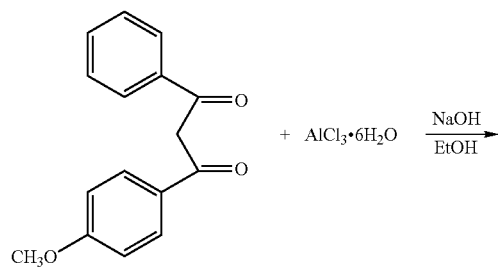

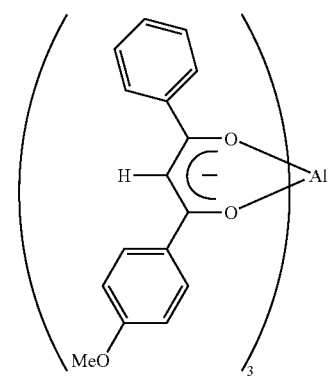

An electroluminescent was fabricated as in Example 1 and the colour coordinates of the emitted light were x=0.36, y=0.41 and $\lambda_{max}$ (emission) was 550 nm.

EXAMPLE 7

Preparation of Scandium (1,3-Bis-(4-methoxy-phenyl)-propane-1,3 dione)

The anion of 1,3-bis-(4-methoxy-phenyl)-propane-1,3 dione was prepared by the addition of equimolar amounts of NaOH (3.5 mM in 10 ml water) to an ethanolic solution of 1,3-bis-(4-methoxy-phenyl)-propane-1,3 dione (3.5 mM in 50 ml ethanol) at 60° C. The introduction of an aqueous solution of ScCl$_3$.6H$_2$O (1.1 mM in 15 ml water) to the anion mixture afforded the desired complex as a pale yellow powder—after stirring for 3 hours at 60° C. The compound was suction filtered and thoroughly washed with water followed by a small amount of ethanol. It was dried at 75° C. for 8 hours. mp 335° C. Yield 65%. Elemental analysis of Sc complex found C, 67.91; H, 5.21% Calc. for Sc(C$_{51}$H$_{45}$O$_{12}$): C, 68.38; H, 5.02%

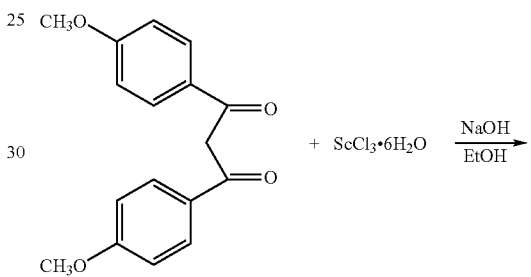

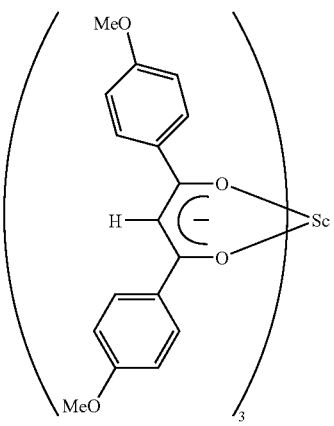

An electroluminescent was fabricated as in Example 1 and the colour coordinates of the emitted light were x=0.25, y=0.3 and $\lambda_{max}$ (emission) was 465 nm.

EXAMPLE 8

Preparation of Scandium (1-(4-methoxy-phenyl)-propane-1,3 dione)

The anion of 1-(4-methoxy-phenyl)-3-phenyl-propane-1,3 dione was prepared by addition of equimolar amounts of NaOH (3.9 mM in 15 ml water) to an ethanolic solution of 1-(4-methoxy-phenyl)-3-phenyl-propane-1,3 dione (3.9 mM in 50 ml ethanol) at 60° C. Introduction of aqueous solution of ScCl$_3$.6H$_2$O (1.3 mM in 20 ml water) to the anion mixture afforded the desired complex as a pale yellow powder after stirring for 3 hours at 60° C. The compound was suction filtered and thoroughly washed with water followed by a small amount of ethanol. It was dried at 75° C. for 8 hours.

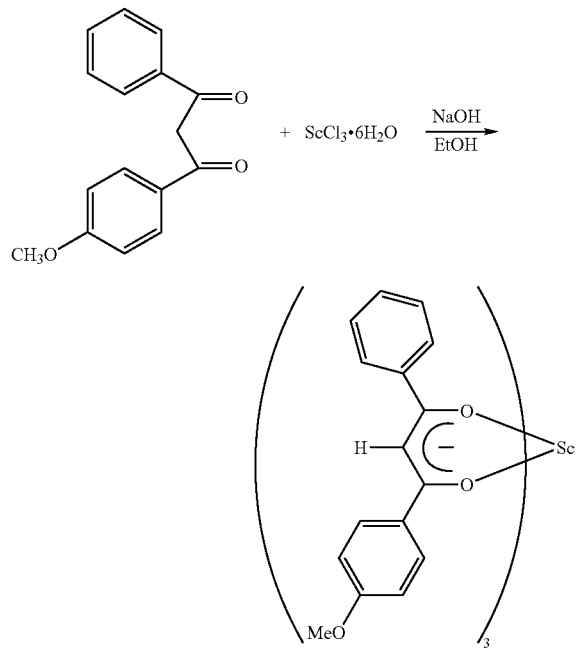

An electroluminescent was fabricated as in Example 1 and the colour coordinates of the emitted light were x=0.36, y=0.41 and $\lambda_{max}$ (emission) was 550 nm.

EXAMPLE 9

Preparation of Scandium (1,3-di-p-tolyl-propane-],3 dione)

The anion of 1,3-di-p-tolyl-propane-],3 dione was prepared by adding of equimolar amounts of NaOH (2.9 mM in 10 ml water) to an ethanolic solution of 1,3-di-tolyl-propane-1,3 dione (2.9 mM in 50 ml ethanol) at 60° C. Introduction of aqueous solution of AlCl$_3$.6H$_2$0 (0.9 mM in 15 ml water) to the anion mixture afforded the desired complex as a pale yellow powder after stirring for 3 hours at 60° C. The compound was suction filtered and thoroughly washed with water followed by a small amount of ethanol. It was dried at 75° C. for 8 hours.

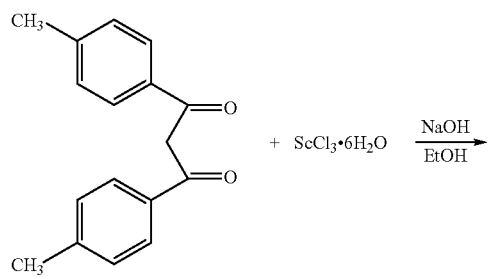

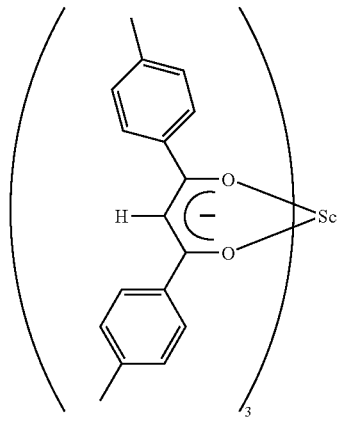

An electroluminescent was fabricated as in Example 1 and the colour coordinates of the emitted light were x=0.17, y=0.23 and $\lambda_{max}$ (emission) was 465 nm.

EXAMPLE 10

Preparation of Al(L$_\alpha$)$_2$(L$_1$)

(L$_\alpha$) was

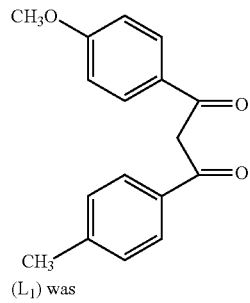

(L$_1$) was

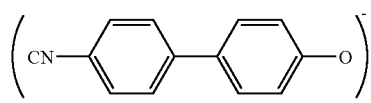

Figure 25:
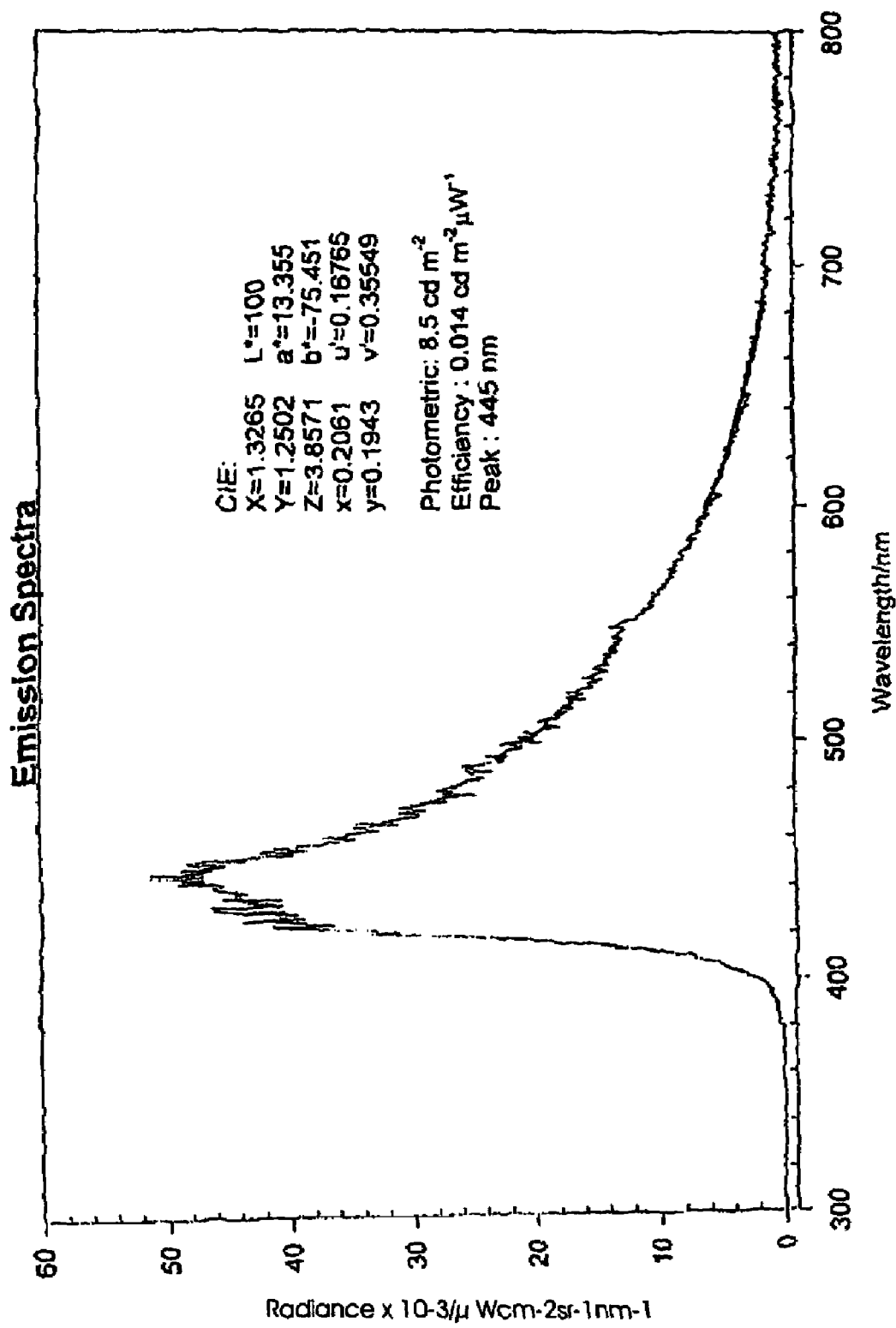
FIG. 25 is a plot of radiance against wavelength for the device of Example 10 as described in this application.

The mixed complex was made by the procedure of example 5 and an electroluminescent device was fabricated as in Example 1 and the emission spectrum is shown in FIG. 25.

The invention claimed is:

1. An electroluminescent device comprising:
    (i) a first electrode;
    (ii) a second electrode; and
    (iii) a layer of an electroluminescent material positioned between said first and second electrodes, wherein said electroluminescent material contains a blue light-emitting metal compound selected from the group consisting of chemical compounds having one of the following formulas electroluminescent material contains a blue light-emitting metal compound having one of the following formulas

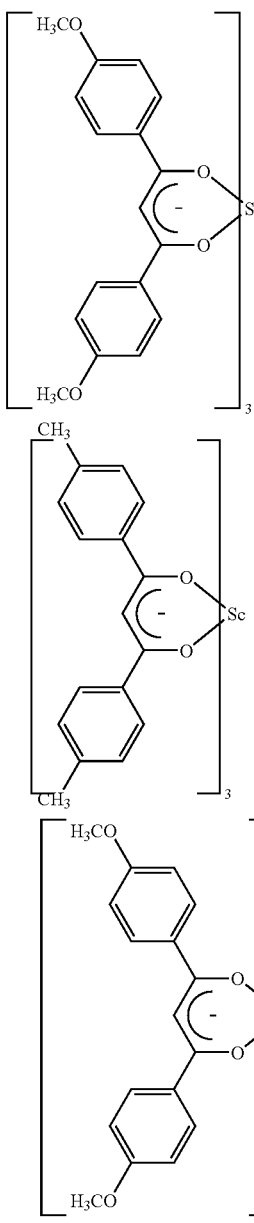

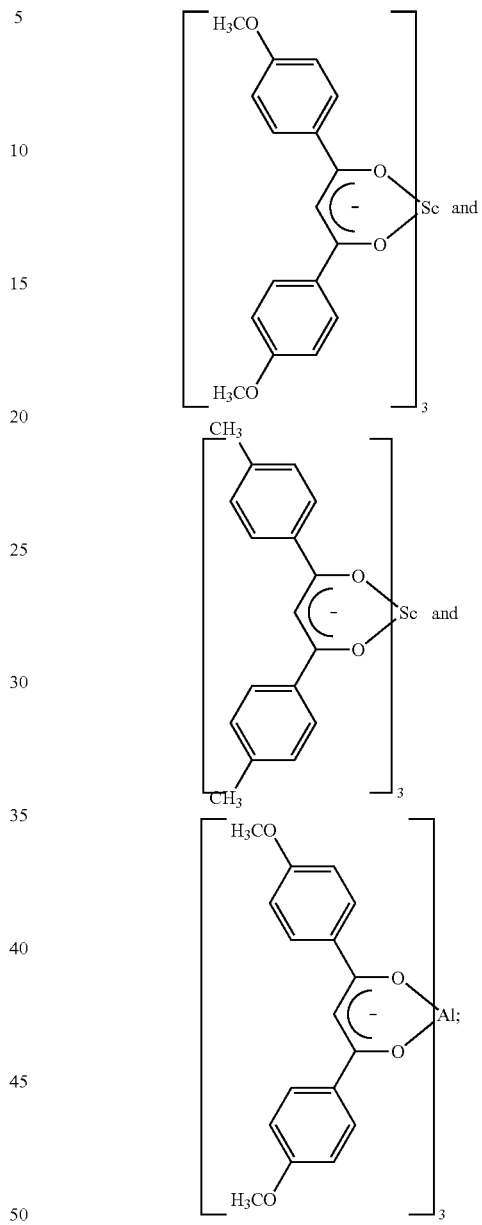

(iv) a layer of a hole transmitting material between the first electrode and the layer of electroluminescent material; and (v) a layer of an electron transmitting material between the second electrode and the layer of electroluminescent material.

8. An electroluminescent device according to claim 7, wherein the layer of hole transmitting material comprises N,N'-diphenyl-N,N'-bis(3-methylphenyl)-1,1'-biphenyl-4,4'-diamine (TPD).

9. An electroluminescent device according to claim 7 wherein the layer of electron transmitting material comprises a metal quinolate.

10. An electroluminescent device according to claim 7 wherein the layer of electron transmitting material comprises aluminum quinolate or lithium quinolate.

2. The device of claim 1 wherein there is a layer of a hole transmitting material between the first electrode and the layer of electroluminescent material.

3. The device of claim 2, wherein the hole transmitting layer comprises N,N'-diphenyl-N,N'-bis(3-methylphenyl)-1,1'-biphenyl-4,4'-diamine (TPD).

4. The device of claim 1 wherein there is a layer of an electron transmitting material between the second electrode and the layer of electroluminescent material.

5. The device of claim 4 wherein the electron transmitting material comprises a metal quinolate.

6. The device of claim 5 wherein the metal quinolate is aluminum quinolate or lithium quinolate.

7. An electroluminescent device comprising:
(i) a first electrode;
(ii) a second electrode;
(iii) a layer of an electroluminescent material positioned between said first and second electrodes, wherein said

11. An electroluminescent device comprising:
(i) a first electrode;
(ii) a second electrode;
(iii) a layer of an electroluminescent material positioned between said first and second electrodes, wherein said electroluminescent material contains a blue light-emitting metal compound having one of the following formulas

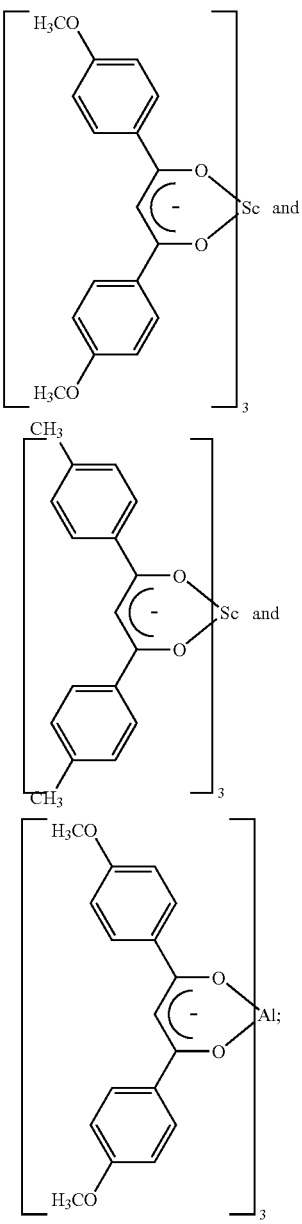

(iv) a layer of a hole transmitting material between the first electrode and the layer of electroluminescent material, wherein the layer of hole transmitting material comprises N,N'-diphenyl-N,N'-bis(3-methylphenyl)-1,1'-biphenyl-4,4'-diamine (TPD); and
(v) a layer of an electron transmitting material between the second electrode and the layer of electroluminescent material, wherein the layer of electron transmitting material comprises aluminum quinolate or lithium quinolate.

12. An electroluminescent device comprising:
(i) a first electrode;
(ii) a second electrode; and
(iii) a layer of an electroluminescent material positioned between said first and second electrodes, wherein said electroluminescent material contains a blue light-emitting metal compound having the following formula

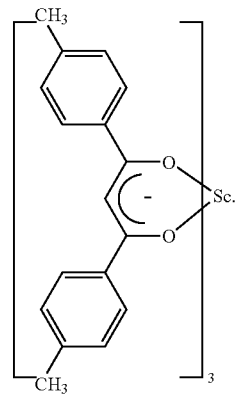

13. The device of claim 12 wherein there is a layer of a hole transmitting material between the first electrode and the layer of electroluminescent material.

14. The device of claim 13 wherein the hole transmitting layer comprises N,N'-diphenyl-N,N'-bis(3-methylphenyl)-1,1'-biphenyl-4,4'-diamine (TPD).

15. The device of claim 12 wherein there is a layer of an electron transmitting material between the second electrode and the layer of electroluminescent material.

16. The device of claim 15 wherein the electron transmitting material comprises a metal quinolate.

17. The device of claim 16 wherein the metal quinolate is aluminum quinolate or lithium quinolate.

\* \* \* \* \*